(12) United States Patent
Jo et al.

(10) Patent No.: US 12,317,701 B2
(45) Date of Patent: May 27, 2025

(54) DISPLAY DEVICE

(71) Applicant: SAMSUNG DISPLAY CO., LTD., Yongin-si (KR)

(72) Inventors: Kang Bin Jo, Suwon-si (KR); Go Eun Cha, Suwon-si (KR); Kyung Tea Park, Seoul (KR); Jong Hyun Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 765 days.

(21) Appl. No.: 17/472,842

(22) Filed: Sep. 13, 2021

(65) Prior Publication Data

US 2022/0165834 A1 May 26, 2022

(30) Foreign Application Priority Data

Nov. 25, 2020 (KR) .................. 10-2020-0159701

(51) Int. Cl.
*H10K 59/131* (2023.01)
*G06V 40/13* (2022.01)
*H10K 59/121* (2023.01)
*H10K 59/35* (2023.01)
*H10K 59/60* (2023.01)

(52) U.S. Cl.
CPC ....... *H10K 59/131* (2023.02); *G06V 40/1318* (2022.01); *H10K 59/1213* (2023.02); *H10K 59/353* (2023.02); *H10K 59/60* (2023.02)

(58) Field of Classification Search
CPC ...... G09G 3/3266; G09G 3/32; G09G 3/3233; G09G 3/3225; G06F 3/04; G06F 3/0414; G06F 3/04144; G06F 3/0418; G06F 3/04189; G06F 3/042; G02F 1/13338
USPC ............ 345/173–174; 349/12; 361/749–750, 361/782–784
See application file for complete search history.

(56) References Cited

U.S. PATENT DOCUMENTS

| | | | |
|---|---|---|---|
| 9,606,655 B2 * | 3/2017 | Choo | G06F 3/04166 |
| 11,257,457 B2 * | 2/2022 | Kawashima | G09G 3/3688 |
| 2005/0180083 A1 * | 8/2005 | Takahara | H10K 59/88 |
| | | | 361/152 |
| 2008/0136983 A1 * | 6/2008 | Huang | G09G 3/3659 |
| | | | 345/87 |
| 2010/0026636 A1 * | 2/2010 | Jang | G02F 1/13338 |
| | | | 345/173 |
| 2010/0039425 A1 * | 2/2010 | Chen | G09G 3/3659 |
| | | | 345/88 |
| 2011/0115724 A1 * | 5/2011 | Jeon | G06F 3/042 |
| | | | 345/173 |
| 2011/0248978 A1 * | 10/2011 | Koyama | G02F 1/136286 |
| | | | 345/94 |

(Continued)

*Primary Examiner* — Tuan T Dinh
(74) *Attorney, Agent, or Firm* — F. CHAU & ASSOCIATES, LLC

(57) ABSTRACT

A display device includes a display panel having a plurality of pixels connected to gate lines and data lines, and a plurality of fingerprint sensors connected to sensing lines and read-out lines. A gate driver provides gate signals to the gate lines and provides sensing signals to the sensing lines. The gate driver includes a first gate signal supply module providing a first gate signal to a first gate line among the gate lines. A first switching element is turned on by a reset enable signal to connect the first gate line and a first sensing line among the sensing lines.

19 Claims, 11 Drawing Sheets

(56) References Cited

U.S. PATENT DOCUMENTS

| | | | |
|---|---|---|---|
| 2012/0262384 A1* | 10/2012 | Kim | G06F 3/04184 |
| | | | 345/173 |
| 2013/0162602 A1* | 6/2013 | Nakagawa | G06F 3/042 |
| | | | 345/175 |
| 2020/0065541 A1* | 2/2020 | Jung | G06V 40/1365 |
| 2020/0161493 A1* | 5/2020 | Lee | G06F 3/04184 |
| 2021/0158751 A1 | 5/2021 | Cha et al. | |

* cited by examiner

SP: SP1, SP2, SP3

DISPLAY DEVICE

CROSS-REFERENCE TO RELATED APPLICATION

This application claims priority under 35 U.S.C. § 119 to Korean Patent Application No. 10-2020-0159701, filed on Nov. 25, 2020 in the Korean Intellectual Property Office, the disclosure of which is incorporated by reference in its entirety herein.

1. TECHNICAL FIELD

The present inventive concepts relate to a display device.

2. DISCUSSION OF RELATED ART

As the information society has developed, the demand for display devices for displaying images has diversified. For example, display devices have been applied to various electronic devices such as smart phones, digital cameras, notebook computers, navigation systems, and smart televisions. Examples of display devices include flat panel display devices such as a liquid crystal display (LCD) device, a field emission display (FED) device, or an organic light-emitting diode (OLED) display device.

A display device may include a display panel for displaying an image, an optical sensor for detecting light, a fingerprint sensor for detecting a person's fingerprint, and the like. As display devices have been applied to an increasing variety of electronic devices, the design of display devices has varied. For example, the display area of a display device may be widened by eliminating a sensor device such as an optical sensor or a fingerprint sensor.

SUMMARY

Embodiments of the present inventive concepts provide a display device having a plurality of pixels and fingerprint sensors disposed in the same layer therein and capable of increasing the duration of exposure of the fingerprint sensors to light even when hysteresis compensation is being performed.

However, embodiments of the present inventive concepts are not restricted to those set forth herein. The above and other embodiments of the present inventive concepts will become more apparent to one of ordinary skill in the art to which the present inventive concepts pertain by referencing the detailed description of embodiments given below.

According to an embodiment of the present inventive concepts, a display device includes a display panel having a plurality of pixels connected to gate lines and data lines, and a plurality of fingerprint sensors connected to sensing lines and read-out lines. A gate driver provides gate signals to the gate lines and sensing signals to the sensing lines. The gate driver includes a first gate signal supply module providing a first gate signal to a first gate line among the gate lines. A first switching element is turned on by a reset enable signal to connect the first gate line and a first sensing line among the sensing lines.

In an embodiment, in response to the reset enable signal being received when the first gate signal has a gate-on level, the first switching element may, provide a reset signal to the first sensing line.

In an embodiment where the first gate signal may have the gate-on level during multiple horizontal scanning periods of a single frame, the reset enable signal may be provided to the first switching element during the final horizontal scanning period of the multiple horizontal scanning periods.

In an embodiment, the first gate signal may have the gate-on level over a plurality of frames, and the reset enable signal may be provided to the first switching element over at least one of the frames.

In an embodiment, the gate driver further may comprise a second gate signal supply module providing a second gate signal to a second gate line among the gate lines, and a second switching element turned on by a scan enable signal to connect the second gate line to a second sensing line among the sensing lines.

In an embodiment, in response to the scan enable signal being received when the second gate signal has a gate-on level, the second switching element may provide a scan signal to the second sensing line.

In an embodiment in which the second gate signal has the gate-on level during multiple horizontal scanning periods of a single frame, the scan enable signal may be provided to the second switching element during the final horizontal scanning period of the multiple horizontal scanning periods.

In an embodiment, each of the fingerprint sensors may comprise: a light-receiving element, a first sensor transistor providing a common voltage to a second node based on the voltage of a first node, the first node is a first electrode of the light-receiving element, a second sensor transistor selectively connecting the second node and one of the read-out lines, and a third sensor transistor selectively providing a reset voltage to the first node.

In an embodiment, the second sensor transistor may be turned on by the scan signal, and the third sensor transistor may be turned on by the reset signal.

In an embodiment, each of the pixels may comprise: a light-emitting element, a first pixel transistor controlling a driving current that is to be provided to the light-emitting element, a second pixel transistor selectively providing a data voltage to a first node, the first node is a first electrode of the first pixel transistor, a third pixel transistor selectively connecting a second node and a third node, the second node is a second electrode of the first pixel transistor, and the third node is a gate electrode of the first pixel transistor, and a fourth pixel transistor, which selectively provides an initialization voltage to the third node.

In an embodiment, the second and third pixel transistors may be turned on by the first gate signal, and the fourth pixel transistor may be turned on by the second gate signal.

In an embodiment, each of the pixels may further comprise: a fifth pixel transistor selectively providing a driving voltage to the first node, a sixth pixel transistor selectively connecting the second node and a fourth node, the fourth node is a first electrode of the light-emitting element, and a seventh pixel transistor selectively providing the initialization voltage to the fourth node.

In an embodiment, the pixels may comprise first, second, and third pixels emitting light of different colors, the display panel may comprise a plurality of unit pixel areas, and each of the unit pixel areas may comprise the first, second, and third pixels and at least one fingerprint sensor.

In an embodiment, the display panel may comprise: a substrate, a thin-film transistor (TFT) layer disposed on the substrate, and a light-emitting element layer disposed on the thin-film transistor layer. The thin-film transistor layer may comprise: a gate insulating film disposed on the substrate, and an interlayer insulating film disposed on the gate insulating film. Light-emitting elements of the pixels and light-receiving elements of the fingerprint sensors may be disposed in the light-emitting element layer.

In an embodiment, each of the pixels may comprise: an active area, a source electrode, and a drain electrode of a pixel transistor disposed on the substrate, a gate electrode of the pixel transistor disposed on the gate insulating film, and a first connecting electrode disposed on the interlayer insulating film and is connected to the drain electrode of the pixel transistor.

In an embodiment, each of the light-emitting elements may comprise: a pixel electrode disposed on the thin-film transistor layer and is connected to the first connecting electrode, a light-emitting layer disposed on the pixel electrode, and a common electrode disposed on the light-emitting layer.

In an embodiment, each of the fingerprint sensors may comprise: an active area, a source electrode, and a drain electrode of a sensor transistor disposed on the substrate, a gate electrode of the sensor transistor disposed on the gate insulating film, and a second connecting electrode disposed on the interlayer insulating film and is connected to the drain electrode of the sensor transistor.

In an embodiment, each of the light-receiving elements may comprise: a sensor electrode disposed on the thin-film transistor layer and is connected to the second connecting electrode, a light-receiving layer disposed on the sensor electrode, and a common electrode disposed on the light-receiving layer.

In an embodiment, the display panel may further comprise a display driver providing data voltages to the data lines and receives sensing signals from the read-out lines.

In an embodiment, the gate lines and the sensing lines may extend in a first direction and may be spaced apart from one another in a second direction intersecting the first direction. The data lines and the read-out lines may extend in the second direction and may be spaced apart from one another in the first direction.

According to an embodiment of the present inventive concepts, a display device includes a display panel comprising a plurality of pixels having light-emitting elements and a plurality of fingerprint sensors having light-receiving elements. The light-emitting elements and the light-receiving elements are disposed in a light-emitting element layer and are spaced apart from each other by a pixel defining film. A gate driver provides gate signals to the plurality of pixels and sensing signals to the plurality of fingerprint sensors. The gate driver provides at least one gate signal having a gate-on level during a plurality of horizontal scanning periods of a single frame. The gate driver provides at least one of a reset signal and a scan signal to the plurality of fingerprint sensors for activating the light-receiving elements, the at least one reset signal and scan signal are independent from the at least one gate signal.

According to the aforementioned and other embodiments of the present inventive concepts, a plurality of pixels and a plurality of fingerprint sensors can be disposed in the same layer, and a gate driver can drive the pixels based on a gate signal. As the gate signal has a gate-on level during multiple horizontal scanning periods of a single period, a display device can perform hysteresis compensation on the pixels. As the gate driver provides a reset signal and a scan signal, which are independent from the gate signal, to the fingerprint sensors, the gate driver can increase the duration of exposure of the fingerprint sensors to light and increase the sensitivity of the fingerprint sensors, even when the display device is performing hysteresis compensation.

Other features and embodiments may be apparent from the following detailed description, the drawings, and the claims.

BRIEF DESCRIPTION OF THE DRAWINGS

The above and other embodiments and features of the present inventive concepts will become more apparent by describing in detail embodiments thereof with reference to the attached drawings, in which.

DETAILED DESCRIPTION OF EMBODIMENTS

Figure 1:
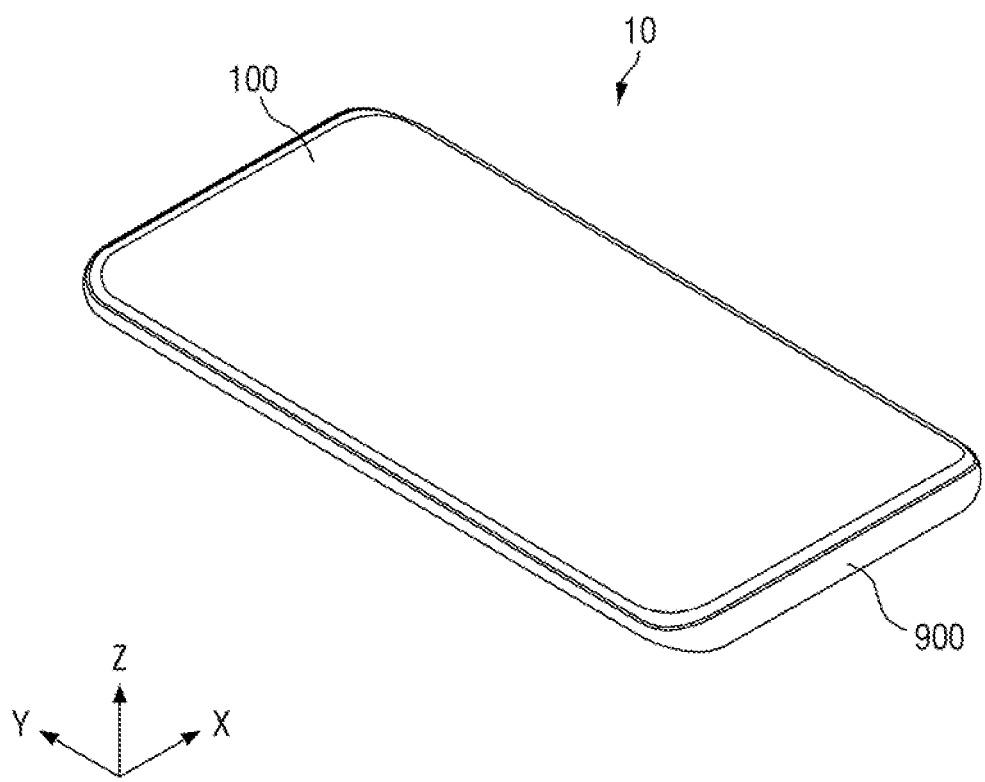
FIG. 1 is a perspective view of a display device according to an embodiment of the present inventive concepts.

In the following description, for the purposes of explanation, numerous details are set forth to provide a thorough understanding of various embodiments or implementations of the present inventive concepts. As used herein "embodiments" and "implementations" are interchangeable words that are non-limiting examples of devices or methods employing one or more of the present inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the present inventive concepts.

Unless otherwise specified, the illustrated embodiments are to be understood as providing non-limiting features of varying detail of some ways in which the present inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the present inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or in an order opposite to the described order. Also, like reference numerals denote like elements.

When an element, such as a layer, is referred to as being "on" "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the present inventive concepts.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features, Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to cross-sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some embodiments are described and illustrated herein in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In an embodiment in which the blocks, units, and/or modules are implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the present inventive concepts. Further, the blocks, units, and/or modules of some embodiments may be physically combined into more complex blocks, units, and/or modules without departing from the scope of the present inventive concepts.

Unless otherwise defined, all terms (including technical and scientific terms) used herein have the same meaning as commonly understood by one of ordinary skill in the art to which the present inventive concepts pertain. Terms, such as those defined in used dictionaries, should be interpreted as having a meaning that is consistent with their meaning in the context of the relevant art and should not be interpreted in an idealized or overly formal sense, unless expressly defined herein.

Figure 2:
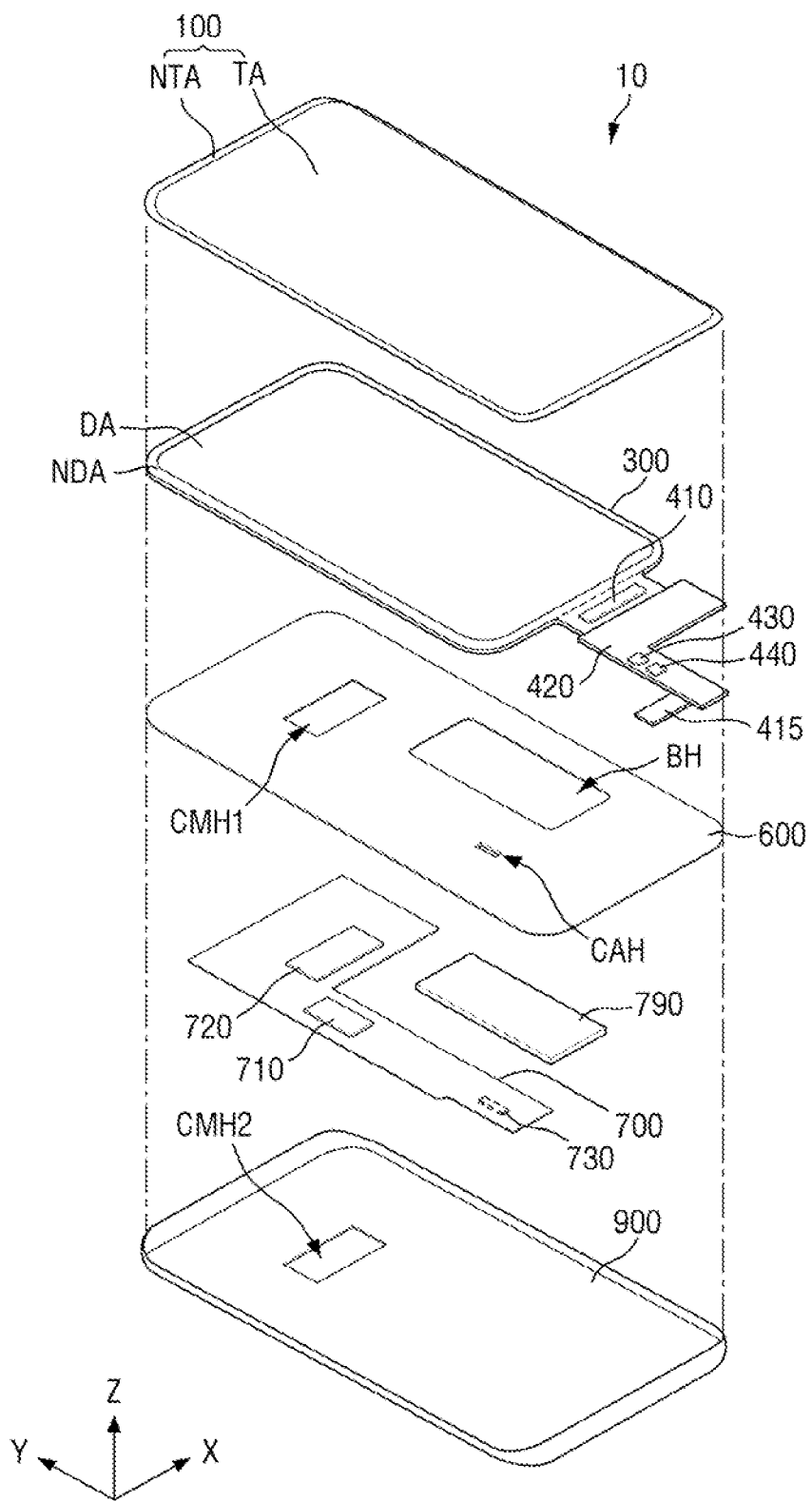
FIG. 2 is an exploded perspective view of the display device of FIG. 1 according to an embodiment of the present inventive concepts.
Figure 3:
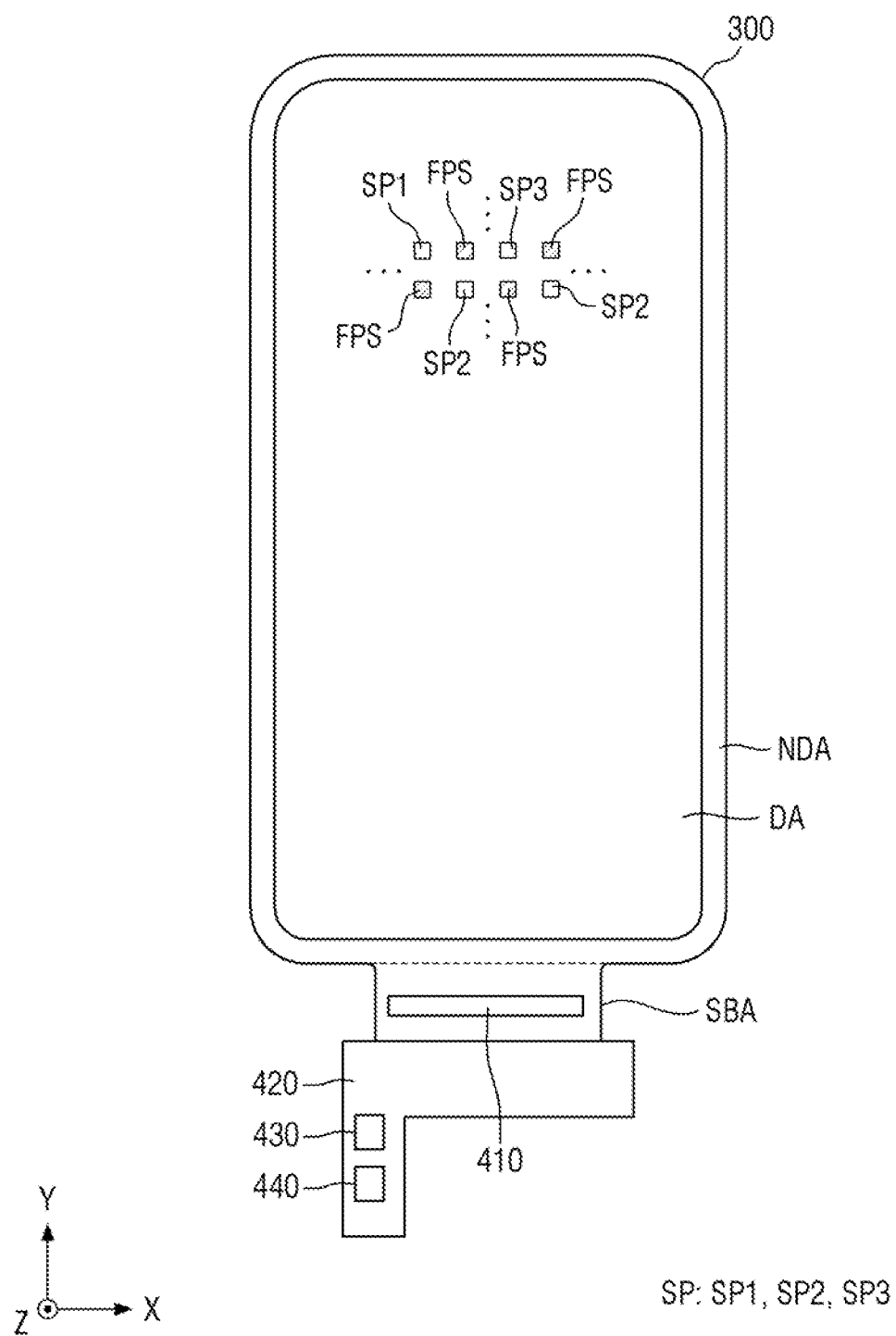
FIG. 3 is a plan view of a display panel of the display device of FIG. 1 according to an embodiment of the present inventive concepts.

FIG. 1 is a perspective view of a display device according to an embodiment of the present inventive concepts, FIG. 2 is an exploded perspective view of the display device of FIG. 1, and FIG. 3 is a plan view of a display panel of the display device of FIG. 1.

Referring to the embodiments of FIGS. 1 through 3, a display device 10 includes a cover window 100, a display panel 300, a bracket 600, a main circuit board 700, and a lower cover 900.

The terms "on", "top", and "top surface", as used herein, may refer to an upward direction from the display device 10, e.g., a Z-axis direction, and the terms "below", "bottom" and "bottom surface", as used herein, may refer to a downward direction from the display device 10, e.g., the opposite direction of the Z-axis direction. Also, the terms "left", "right", "upper", and "lower", as used herein, may refer to their respective directions as viewed from above the display device 10. For example, the terms "left", "right", "upper", and "lower" may refer to the opposite direction of an X-axis direction, the X-axis direction, a Y-axis direction, and the opposite direction of the Y-axis direction, respectively.

The display device 10, which is a device for displaying at least one moving and/or still image, may be used not only in a portable electronic device such as a mobile phone, a smartphone, a tablet personal computer (PC), a smartwatch, a watchphone, a mobile communication terminal, an electronic notepad, an electronic book (e-book), a portable multimedia player (PMP), a navigation device, or a ultra-mobile PC (UMPC)), but also in various other electronic devices such as a television (TV), a laptop computer, a monitor, a billboard, or an Internet-of-Things (IoT) device. However, embodiments of the present inventive concepts are not limited thereto.

As shown in the embodiment of FIGS. 1-3, the display device 10 may have a rectangular shape in a plan view. For example, the display device 10 may have a rectangular shape with relatively shorter sides in a first direction (or the X-axis direction) and relatively longer sides in a second direction (or the Y-axis direction), in a plan view. However, embodiments of the present inventive concepts are not limited thereto. The corners where the relatively shorter sides and the relatively longer sides meet may be rounded to have a predetermined curvature or may be right-angled. However, the shape of the display device 10 is not particularly limited, and the display device 10 may have various other shapes such as a non-tetragonal polygonal shape, a circular shape, or an elliptical shape in a plan view.

The cover window 100 may be disposed on the display panel 300 to cover the top surface of the display panel 300. The cover window 100 may protect the top surface of the display panel 300.

The cover window 100 may include a transmitting area TA, which corresponds to (e.g., overlaps in the Z-axis direction) a display area DA of the display panel 300, and a non-transmitting area NDA, Which corresponds to (e.g., overlaps in the Z-axis direction) a non-display area NDA of the display panel 300. In an embodiment, the non-transmitting area NTA may be formed to be opaque. In another embodiment, the non-transmitting area NTA may be formed as a decorative layer having, formed thereon, a pattern that can be seen when an image is not displayed. However, embodiments of the present inventive concepts are not limited thereto.

The display panel 300 may be disposed below the cover window 100. Thus, an image displayed by the display panel 300 can be viewed on the top surface of the display device 10 through the cover window 100.

In an embodiment, the display panel 300 may be a light-emitting display panel including light-emitting elements. For example, the display panel 300 may be an organic light-emitting diode (OLED) display panel using OLEDs that include organic light-emitting layers, a micro-light-emitting diode (mLED) display panel using mLEDs, a quantum-dot light-emitting diode (QLED) display panel using QLEDs that include quantum-dot light-emitting layers, or an inorganic light-emitting display panel using inorganic light-emitting elements that include an inorganic semiconductor. The display panel 300 will hereinafter be described as being, for example, an OLED display panel for convenience of explanation. However, embodiments of the present inventive concepts are not limited thereto.

The display panel 300 may include the display panel DA and the non-display area NDA.

The display area. DA may overlap with the transmitting area TA of the cover window 100 (e.g., in a Z-axis direction). As shown in the embodiment of FIG. 3, the display area DA may include a plurality of pixels SP and may display an image. The pixels SP may include first subpixels SP1, second subpixels SP2, and third subpixels SP3. In an embodiment, the first subpixels SP1 may emit red light, the second subpixels SP2 may emit green light, and the third subpixels SP3 may emit blue light. However, embodiments of the present inventive concepts are not limited thereto and the number of the pixels SP and the colors that the pixels SP emit may vary. In an embodiment, the emission areas or the aperture areas of the first subpixels SP1, the second subpixels SP2, and the third subpixels SP3 may have different sizes. However, embodiments of the present inventive concepts are not limited thereto.

The display area DA may include a plurality of fingerprint sensors FPS and may thus be able to recognize a fingerprint of a user. The pixels SP and the fingerprint sensors FPS may be disposed in the same layer of the display panel 300. In an embodiment, each of the fingerprint sensors FPS may be surrounded by multiple pixels SP. Thus, the display area DA may be used not only for displaying an image, but also for recognizing the user's fingerprint. In an embodiment, the fingerprint sensors FPS may be disposed in the entire display area DA. However, embodiments of the present inventive concepts are not limited thereto. For example, the fingerprint sensors FPS may be disposed in only a partial portion of the display area DA.

The non-display area NDA may not display an image. As shown in the embodiments of FIGS. 2-3, the non-display area NDA may be disposed around the display area DA. In an embodiment, the non-display area NDA may include a gate driver applying gate signals to gate lines and fan-out lines connecting data lines and a display driver 410. The non-display area NDA may surround the display area DA. For example, the non-display area NDA may completely surround the display area DA (e.g., in the first and second directions). However, embodiments of the present inventive concepts are not limited thereto.

In an embodiment, the display panel 300 may include a touch electrode layer capable of detecting an object such as a finger of the user or a pen. The touch electrode layer may include a plurality of touch electrodes and may be disposed in a display area in which the pixels SP are disposed.

The display panel 300 may further include a sub-area SBA, which protrudes from one side of the non-display area NDA. The sub-area SBA may include a pad portion, which is connected to a circuit board 420.

The sub-area SBA may protrude from one side of the non-display area NDA in the opposite direction of the second direction (or the Y-axis direction). For example, the length, in the first direction (or the X-axis direction), of the sub-area SBA may be less than the length, in the first direction (or the X-axis direction), of the display area DA, and the length, in the second direction (or the Y-axis direction), of the sub-area SBA may be less than the length, in the second direction (or the Y-axis direction), of the display area DA. However, embodiments of the present inventive concepts are not limited thereto. The sub-area SBA may be bendable and may be disposed below the display panel 300. In this embodiment, the sub-area SBA may be bent to overlap with the display area DA in the third direction (or the Z-axis direction).

The display panel 300 may include the display driver 410, the circuit board 420, a power supply 430, and a touch driver 440.

The display driver 410 may be disposed in the sub-area SBA of the display panel 300. The display driver 410 may output signals and voltages for driving the display panel 300. In an embodiment, the display driver 410 may provide data voltages to the data lines, and the data voltages may be provided to the pixels SP via the data lines. The display driver 410 may be connected to the fingerprint sensors FPS via read-out lines. The display driver 410 may receive sensing signals from the fingerprint sensors FPS via the read-out lines. The display driver 410 may convert the sensing signals into sensing data, which is digital data, and may transmit the sensing data to a main processor 710. The display driver 410 may provide gate control signals to the gate driver and may provide various power supply voltages to power supply lines.

The circuit board 420 may be attached on the pad portion, which is disposed in the sub-area SBA of the display panel 300. In an embodiment, the circuit board 420 may be attached on the pad portion in the sub-area SBA of the display panel 300 via a low-resistance, high-reliability material such as an anisotropic conductive film (ACF) or a self-assembly anisotropic conductive paste (SAP). However, embodiments of the present inventive concepts are not limited thereto and the circuit board 420 may be attached on the pad portion in the sub-area SBA by various different methods. Lead lines of the circuit board 420 may be electrically connected to the pad portion of the display panel 300. In an embodiment, the circuit board 420 may be a printed circuit board (PCB), a flexible PCB (FPCB), or a flexible film such as a chip-on-film (COF).

The power supply 430 may be disposed on the circuit board 420 and may supply power supply voltages to the display driver 410 and the display panel 300. In an embodiment, the power supply 430 may generate a driving voltage and may provide the driving voltage to a driving voltage line. For example, the power supply 430 may generate a low-potential voltage and may provide the low-potential voltage to the cathode electrodes of light-emitting elements of the pixels SP and the cathode electrodes of light-receiving elements of the fingerprint sensors FPS.

The touch driver 440 may be disposed on the circuit board 420 to measure the static capacitances of the touch electrodes. In an embodiment, the touch driver 440 may determine the presence of a touch of the user and the location of the touch based on variations in the static capacitances of the touch electrodes. Here, the term "touch", as used herein, means a direct touch of a finger of the user or an object such as a pen on one surface of the display device 10, on the touch electrode layer. The touch driver 440 may determine the location of the touch of the user by distinguishing touch electrodes where the touch of the user occurs from touch electrodes where the touch of the user does not occur.

As shown in the embodiment of FIG. 2, the bracket 600 may be disposed below the display panel 300. In an embodiment, the bracket 600 may be formed of plastic, a metal, or a combination thereof. The bracket 600 may include a first camera hole CMH1, in which a first camera sensor 720 is inserted, a battery hole BH, in which a battery 790 is disposed, and a cable hole CAH, which a cable 415 may pass therethrough for connection to the display driver 410 or the circuit board 420.

The main circuit board 700 and the battery 790 may be disposed below the bracket 600. In an embodiment, the main circuit board 700 may be a PCB or an FPCB.

The main circuit board 700 may include the main processor 710, the first camera sensor 720, and a main connector 730. The first camera sensor 720 may be disposed on both the top and bottom surfaces of the main circuit board 700. The main processor 710 may be disposed on the top surface of the main circuit board 700. The main connector 730 may be disposed on the bottom surface of the main circuit board 700. However, embodiments of the present inventive concepts are not limited thereto.

The main processor 710 may control all functions of the display device 10. In an embodiment, the main processor 710 may provide digital video data to the display driver 410 so that the display panel 300 may display an image. The main processor 710 may receive sensing data from the display driver 410 and generate a fingerprint image, and may recognize the pattern of the user's fingerprint. In an embodiment, the main processor 710 may perform authentication or execute an application based on the user's fingerprint. The main processor 710 may receive touch data from the touch driver 440, may determine the coordinates of the touch of the user, and may execute an application pointed to by an icon displayed at the coordinates of the touch of the user. However, embodiments of the present inventive concepts are not limited thereto.

The first camera sensor 720 may process frames of at least one still and/or moving image obtained by an image sensor and may output the processed image frames to the main processor 710. In an embodiment, the first camera sensor 720 may be a complementary metal-oxide semiconductor (CMOS) image sensor or a charge-coupled device (CCD) sensor. However, embodiments of the present inventive concepts are not limited thereto. The first camera sensor 720 may be exposed at the bottom surface of the lower cover 900 through a second camera hole CMH2 and may thus be able to capture an image of an object or the background at the bottom of the display device 10.

The main connector 730 may be connected to the cable 415 through the cable hole CAH of the bracket 600. As a result, the main circuit board 700 is electrically connected to the display driver 410 or the circuit board 420.

In an embodiment, the battery 790 may be disposed not to overlap with the main circuit board 700 in the third direction (or the Z-axis direction). The battery 790 may overlap with the battery hole BH of the bracket 600 (e.g., in the third direction).

The lower cover 900 may be disposed below the main circuit board 700 and the battery 790 (e.g., in the Z-axis direction). The lower cover 900 may be coupled and fixed to the bracket 600. The lower cover 900 may form the bottom exterior of the display device 10.

The lower cover 900 may include the second camera hole CMH2, which exposes the bottom surface of the first camera sensor 720. The location of the first camera sensor 720 and the locations of the first and second camera holes CMH1 and CMH2, which correspond to the first camera sensor 720, are not limited to the arrangement shown in FIG. 2.

Figure 4:
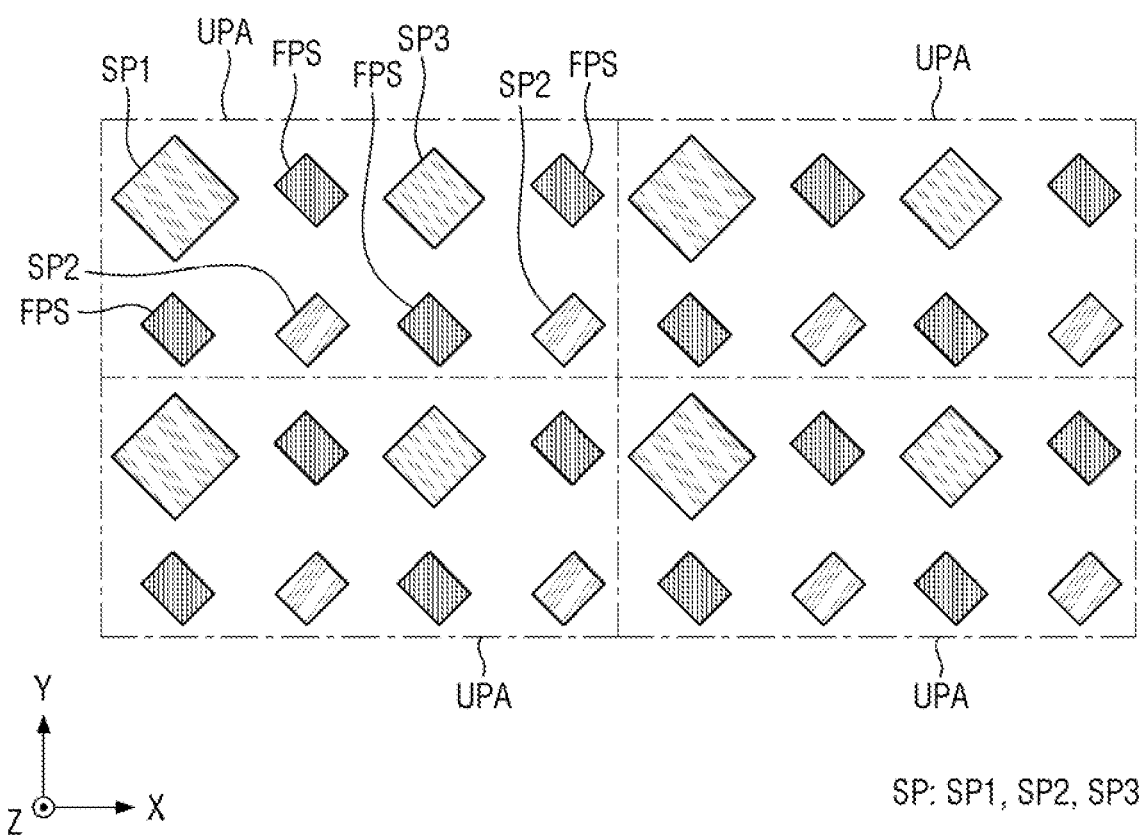
FIG. 4 is a plan view of a unit pixel area of the display device of FIG. 1 according to an embodiment of the present inventive concepts.

FIG. 4 is a plan view of a unit pixel area of the display device of FIG. 1 according to an embodiment of the present inventive concepts.

Referring to the embodiment of FIG. 4, the display area DA of the display panel 300 may include a plurality of unit pixel areas UPA. Each of the unit pixel areas UPA may include at least one first subpixel SP1, at least one second subpixel SP2, at least one third subpixel SP3, and at least one fingerprint sensor FPS. In an embodiment, the first, second, and third subpixels SP1, SP2, and SP3 may emit red light, green light, and blue light, respectively. However, embodiments of the present inventive concepts are not limited thereto and the respective colors emitted by the first, second and third subpixels SP1, SP2, SP3 may vary. As shown in the embodiment of FIG. 4, the first, second, and third subpixels SP1, SP2, and SP3 may be spaced apart from one another (e.g., in the X-axis and/or Y axis direction) by the fingerprint sensor FPS. Each of the fingerprint sensors FPS may be surrounded by multiple pixels SP. For example, as shown in the embodiment of FIG. 4, each of the unit pixel areas UPA may include one first subpixel SP1, two second subpixels SP2, one third subpixel SP3, and four fingerprint sensors FPS However, embodiments of the present inventive concepts are not limited thereto.

In an embodiment, the emission areas or aperture areas of the first, second, and third subpixels SP1, SP2, and SP3, respectively, may have different sizes. For example, in an embodiment, the emission area of the first subpixel SN may be larger than the emission area of the third subpixel SP3, and the emission area of the third subpixel SP3 may be larger than the emission area of the second subpixel SP2. The display panel 300 can increase the emission efficiency of white light emitted from each of the unit pixel areas UPA by controlling the sizes of the emission areas of the first, second, and third subpixeis SP1, SP2, and SP3 of each of the unit pixel areas UPA.

Figure 5:
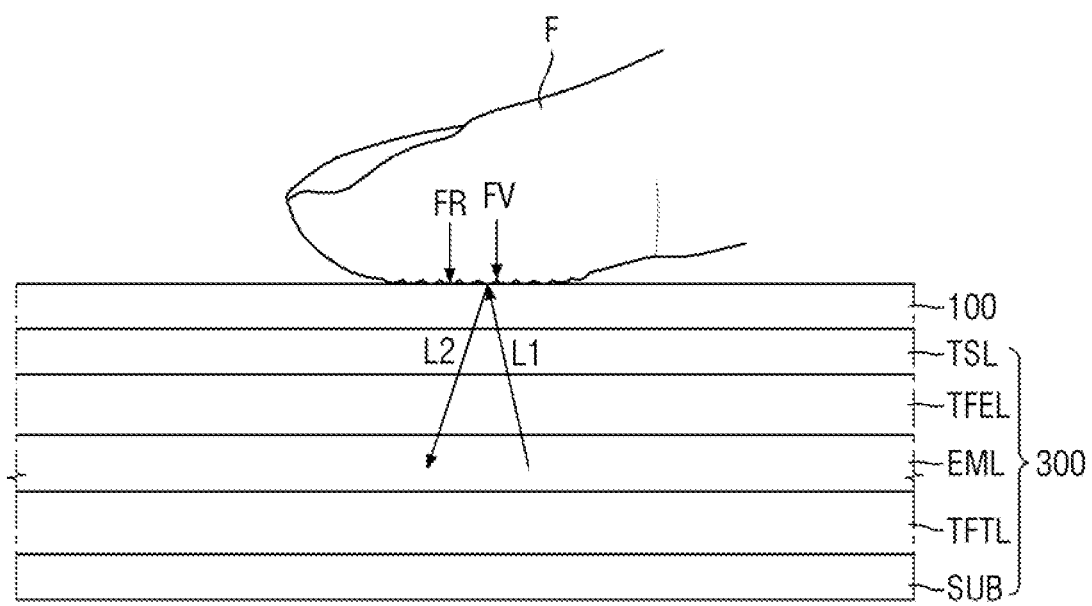
FIG. 5 is a cross-sectional view of the display device of FIG. 1 according to an embodiment of the present inventive concepts.
Figure 6:
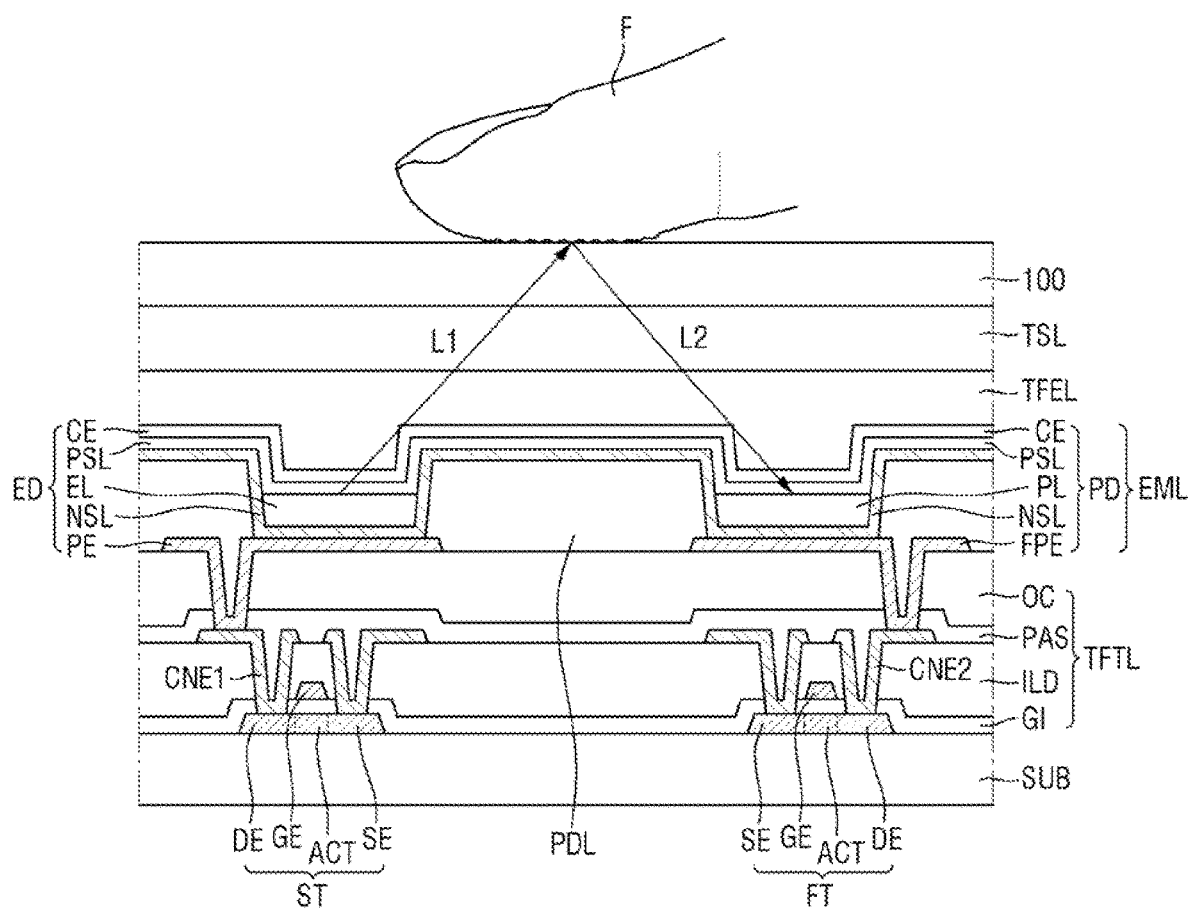
FIG. 6 is a cross-sectional view illustrating a thin-film transistor (TFT) layer and a light-emitting element layer of the display device of FIG. 1 according to an embodiment of the present inventive concepts.

FIG. 5 is a cross-sectional view of the display device of FIG. 1 according to an embodiment of the present inventive concepts. FIG. 6 is a cross-sectional view illustrating a thin-film transistor (TFT) layer and a light-emitting element layer of the display device of FIG. 1 according to an embodiment of the present inventive concepts.

Referring to the embodiments of FIGS. 5 and 6, the display device 10 may include a substrate SUB, a TFT layer TFTL, a light-emitting element layer EML, an encapsulation layer TFEL, a touch sensor layer TSL, and the cover window 100.

The substrate SUB may be a base substrate or a base member of the display panel 300 and may be formed of an insulating material such as a polymer resin. In an embodiment, the substrate SUB may be a rigid substrate. However, embodiments of the present inventive concepts are not limited thereto and the substrate SUB may be a flexible substrate that is bendable, foldable, or rollable. In an embodiment in which the substrate SUB is a flexible substrate, the substrate SUB may include polyimide (PI). However, embodiments of the present inventive concepts are not limited thereto.

The TFT layer arm may be disposed on the substrate SUB (e.g., directly thereon in the Z-axis direction). The TFT layer TFTL may include at least one pixel transistor ST, which is for driving each pixel SP, and at least one sensor transistor FT, which is for driving each fingerprint sensor FPS. The TFT layer TFTL may further include a gate insulating film. GI, an interlayer insulating film ILD, a passivation layer PAS, and a planarization layer OC.

The pixel transistor ST may include a semiconductor region ACT, a source electrode SE, a drain electrode DE, and a gate electrode GE.

The semiconductor region ACT, the source electrode SE, and the drain electrode DE of the pixel transistor ST may be disposed on the substrate SUB. The semiconductor region ACT of the pixel transistor ST may overlap with the gate electrode GE of the pixel transistor ST in a thickness direction of the substrate SUB and may be insulated from the gate electrode GE of the pixel transistor ST by the gate insulating film GI. Each of the source electrode SE and the drain electrode DE of the pixel transistor ST may be obtained by transforming the material of the semiconductor region ACT of the pixel transistor ST into a conductor.

The gate electrode GE of the pixel transistor ST may be disposed on the gate insulating film GI (e.g., directly thereon in a thickness direction of the substrate SUB). The gate electrode GE of the pixel transistor ST may overlap with the semiconductor region ACT of the pixel transistor ST with the gate insulating film GI interposed therebetween (e.g., in a thickness direction of the substrate SUB).

The gate insulating film GI may be disposed on the semiconductor region ACT, the source electrode SE, and the drain electrode DE of the pixel transistor ST (e.g., directly thereon in a thickness direction of the substrate SUB). In an embodiment, the gate insulating film GI may cover the semiconductor region ACT, the source electrode SE, the drain electrode DE of the pixel transistor ST, and the substrate SUB and may insulate the semiconductor region ACT and the gate electrode GE of the pixel transistor ST. As shown in the embodiment of FIG. 6, the gate insulating film. GI may include contact holes and the first and second connecting electrodes CNE1 and CNE2 may pass through the contact holes. For example, the first connecting electrode CNE1 may pass through a contact hole of the gate insulating film GI for connection with the drain electrode DE of the semiconductor region ACT of the pixel transistor ST. The second connecting electrode CNE2 may pass through a contact hole of the gate insulating film GI for connection with the drain electrode DE of the semiconductor region ACT of the sensor transistor FT.

The sensor transistor FT may include an active area ACT, a source electrode SE, a drain electrode DE, and a gate electrode GE.

The semiconductor region ACT, the source electrode SE, and the drain electrode DE of the sensor transistor FT may be disposed on the substrate SUB (e.g., directly thereon in a thickness direction of the substrate SUB). The semiconductor region ACT of the sensor transistor FT may overlap with the gate electrode GE of the sensor transistor FT in the thickness direction of the substrate SUB and may be insulated from the gate electrode GE of the sensor transistor FT by the gate insulating film GI. Each of the source electrode SE and the drain electrode DE of the sensor transistor FT may be obtained by transforming the material of the semiconductor region ACT of the sensor transistor FT into a conductor.

The gate electrode GE of the sensor transistor FT may be disposed on the gate insulating film GI (e.g., directly thereon in a thickness direction of the substrate SUB). The gate electrode of the sensor transistor FT may overlap with the semiconductor region ACT of the sensor transistor FT with the gate insulating film GI interposed therebetween (e.g., in a thickness direction of the substrate SUB).

The interlayer insulating film ILD may be disposed on the gate electrodes GE of the pixel transistor ST and the sensor transistor FT. In an embodiment, the interlayer insulating film ILD may include contact holes and the first and second connecting electrodes CNE1 and CNE2 pass through the contact holes for connection with the drain electrode DE of the semiconductor region ACT of the pixel transistor ST and the drain electrode DE of the sensor transistor FT, respectively. In an embodiment, the contact holes of the interlayer insulating film ILD may be connected to the contact holes of the gate insulating film GI.

The first and second connecting electrodes CNE1 and CNE2 may be disposed on the interlayer insulating film ILD and are spaced apart from each other in a direction parallel to an upper surface of the substrate SUB. The first connecting electrode CNE1 may connect the drain electrode DE of the pixel transistor ST and a pixel electrode PE of a light-emitting element ED. The first connecting electrode CNE1 may be in contact with the drain electrode DE of the pixel transistor ST through one of the contact holes of each of the gate insulating film GI and the interlayer insulating film ILD.

The second connecting electrode CNE2 may connect the drain electrode DE of the sensor transistor FT and a sensor electrode FPE of a light-receiving element PD. The second connecting electrode CNE2 may be in contact with the drain electrode DE of the sensor transistor FT through one of the contact holes of each of the gate insulating film GI and the interlayer insulating film ILD.

The passivation layer PAS may be disposed on the pixel transistor ST and the sensor transistor FT to protect the pixel transistor ST and the sensor transistor FT. In an embodiment, the passivation layer PAS may include contact holes and the pixel electrode PE of the light-emitting element ED and the sensor electrode FPE of the light-receiving element PD pass through the contact holes for connection with the first connecting electrode CNE1 and the second connecting electrode CNE2, respectively.

The planarization layer OC may be disposed on the passivation layer PAS to planarize the upper surfaces of the pixel transistor ST and the sensor transistor FT. In an embodiment, the planarization layer OC may include contact holes and the pixel electrode PE of the light-emitting element ED and the sensor electrode FPE of the light-receiving element PD pass through the contact holes for connection with the first connecting electrode CNE1 and the second connecting electrode CNE2, respectively. In an embodiment, the contact holes of the passivation layer PAS may be connected to the contact holes of the planarization layer OC.

The light-emitting element layer EML may be disposed on the TFT layer TFTL (e.g., directly thereon in a thickness direction of the substrate SUB). The light-emitting element layer EMI: may include the light-emitting element ED, which is connected to the pixel transistor ST, and the light-receiving element PD, which is connected to the sensor transistor FT. Thus, the light-emitting element ED and the light-receiving element PD may be disposed in the same layer and may be spaced apart from each other (e.g., in a direction parallel to an upper surface of the substrate SUB) by a pixel-defining film PDL.

The light-emitting element ED may include the pixel electrode PE, a first semiconductor layer NSL, an emission layer EL, a second semiconductor layer PSL, and a common electrode CE.

The pixel electrode PE may be disposed on the planarization layer OC, In an embodiment, the pixel electrode PE may overlap (e.g., in a thickness direction of the substrate SUB) with an aperture area of the light-emitting element layer EML, defined by the pixel-defining film PDL. The pixel electrode PE may directly contact the first connecting electrode CNE1 through one of the contact holes of each of the planarization layer OC and the passivation layer PAS for connection to the drain electrode DE of the pixel transistor ST. In an embodiment, the pixel electrode PE may function as the anode of the light-emitting element ED.

The first semiconductor layer NSL may be disposed on the pixel electrode PE. In an embodiment, the first semiconductor layer NSL may be an N-type semiconductor layer. The N-type semiconductor layer may supply electrons to the emission layer EL. In an embodiment, the first semiconductor layer NSL may include an electron transport layer and an electron injection layer. However, embodiments of the present inventive concepts are not limited thereto.

The emission layer EL may be disposed on the first semiconductor layer NSL. In an embodiment, the emission layer EL may be an organic emission layer including an organic material. However, embodiments of the present inventive concepts are not limited thereto. In an embodiment in which the emission layer EL is an organic emission layer, the pixel transistor ST may apply a predetermined voltage to the pixel electrode PE of the common electrode CE. As the common electrode CE of the light-emitting element ED receives a cathode voltage or a low-potential voltage, holes and electrons may move to the emission layer EL through the second semiconductor layer PSL and the first semiconductor layer NSL and may combine together in the emission layer EL to emit light.

The second semiconductor layer PSL may be disposed on the emission layer EL. In an embodiment, the second semiconductor layer PSL may be a P-type semiconductor layer. The P-type semiconductor layer may supply holes to the emission layer EL. In an embodiment, the second semiconductor layer PSL may include a hole transport layer and a hole injection layer. However, embodiments of the present inventive concepts are not limited thereto.

The common electrode CE may be disposed on the second semiconductor layer PSL. The common electrode CE may provide a low-potential voltage to the light-emitting element ED, In an embodiment, the common electrode CE may be implemented as an electrode that is provided in common for a plurality of pixels SP and a plurality of fingerprint sensors FPS. However, embodiments of the present inventive concepts are not limited thereto.

The light-receiving element PD may include the sensor electrode FPE, the first semiconductor layer NSL, a light-receiving layer PL, the second semiconductor layer PSL, and the common electrode CE.

The sensor electrode FPE may be disposed on the planarization layer OC. In an embodiment, the sensor electrode FPE may overlap (e.g., in a thickness direction of the substrate SUB) with the aperture area of the light-emitting element layer EMI, defined by the pixel-defining film PDL. The sensor electrode FPE may be connected to the second connecting electrode CNE2 through one of the contact holes of each of the planarization layer OC and the passivation layer PAS for connection to the drain electrode DE of the sensor transistor FT.

In an embodiment, the sensor electrode FPE and the pixel electrode PE may be formed in the same layer using the same material. In an embodiment, the sensor electrode FPE and the pixel electrode PE may be formed as single layers of molybdenum (Mo), titanium (Ti), copper (Cu), or aluminum (Al), stacks of Al and Ti (e.g., Ti/Al/Ti), stacks of Al and indium tin oxide (ITO) (e.g., ITO/Al/ITO), layers of a silver (Ag)-palladium (Pd)-copper (Cu) (APC) alloy, or stacks of an APC alloy and ITO (e.g., ITO/APC/ITO). However, embodiments of the present inventive concepts are not limited thereto and the material of the sensor electrode FPE and the pixel electrode PE may vary.

The first semiconductor layer NSL of the light-receiving element PD may share the first semiconductor layer NSL of the light-emitting element ED. For example, the first semiconductor layer NSL may be disposed on the pixel-defining film PDL and in an aperture area defined therein and may be commonly disposed to overlap (e.g., in a thickness direction of the substrate SUB) the pixel transistor ST and the sensor transistor FT and form the first semiconductor layer NSL of the light-emitting element and the first semiconductor layer NSL of the light-receiving element PD, The first semiconductor layer NSL of the light-receiving element PD may be disposed on the sensor electrode FPE (e.g., directly thereon in a thickness direction of the substrate SUB). In an embodiment, the first semiconductor layer NSL may be an N-type semiconductor layer. The N-type semiconductor layer may supply electrons to the light-receiving layer PL. In an embodiment, the first semiconductor layer NSL may include an electron transport layer and an electron injection layer. However, embodiments of the present inventive concepts are not limited thereto.

The light-receiving layer PL may be disposed on the first semiconductor layer NSL. The light-receiving layer PL may be depleted by the first and second semiconductor layers NSL and PSL, and an electric field may be formed in the Light-receiving layer PL. A second light L2 reflected from a finger F of the user may be incident upon the light-receiving layer PL, and holes and electrons may be drifted by the electric field. Thus, the holes may be collected in the common electrode CE through the second semiconductor layer PSL, and the electrons may be collected in the sensor electrode FPE through the first semiconductor layer NSL.

In an embodiment, the second semiconductor layer PSL may be disposed relatively close to a surface that the second light L2 is incident upon, and the first semiconductor layer NSL may be disposed relatively far from the surface that the second light L2 is incident upon. Since the drift mobility of holes is lower than the drift mobility of electrons, the efficiency of collecting the second light L2 can be maximized by positioning the second semiconductor layer PSL near the surface that the second light L2 is incident upon.

The common electrode C1 may be disposed on the second semiconductor layer PSL. The common electrode CE may include a transparent conductive material capable of transmitting light therethrough. In an embodiment, the common electrode CE may include at least one compound selected from no, indium zinc oxide (IZO), and indium tin zinc oxide (ITZO). However, embodiments of the present inventive concepts are not limited thereto.

The light-emitting element EML may include the pixel-defining film PDL, which defines a plurality of pixels SP and a plurality of fingerprint sensors FP. Pixel electrodes PE of the plurality of light-emitting elements ED and sensor electrodes FPE of the plurality of fingerprint sensors FPS may be spaced apart (e.g., in a direction parallel to an upper surface of the substrate SUB) and insulated from one another by the pixel-defining film PDL.

As shown in the embodiments of FIGS. 5-6, as the finger F of the user is in contact with the cover window 100, first light L1 output from the light-emitting element ED may be reflected by a ridge FR or a valley FV of the finger F, and as a result, the reflected first light, such as the second light L2, may reach the light-receiving element PD. The display driver 410 may generate sensing data by classifying second light L2 reflected from the ridge FR of the finger F and second light L2 reflected from the valley FR of the finger F and may transmit the sensing data to the main processor 710. The main processor 710 may generate a fingerprint image based on the sensing data and may thus recognize the pattern of the user's fingerprint.

The encapsulation layer TEEL may be disposed on (e.g., directly thereon in a thickness direction of the substrate SUB) the light-emitting element layer EML to cover the light-emitting element layer EML. The encapsulation layer TFEL may prevent oxygen or moisture from penetrating into the light-emitting element ED and the light-receiving element PD.

The touch sensor layer TSL may be disposed on the encapsulation layer TFEL directly thereon in a thickness direction of the substrate SUB). The touch sensor layer TSL may include touch electrodes for detecting a touch of the user and pads and touch electrodes for connecting pads and the touch electrodes. In an embodiment, the touch electrodes of the touch sensor layer TSL may be disposed in a touch sensing area, which overlaps with the display area DA of the display panel 300.

The cover window 100 may be disposed on the display panel 300. The cover window 100 may be disposed on the touch sensor layer TSL of the display panel 300 (e.g., directly on in a thickness direction of the substrate SUB). In an embodiment, the cover window 100 may be attached on the touch sensor layer TSL via a transparent adhesive member. However, embodiments of the present inventive concepts are not limited thereto. A top surface of the cover window 100 and the finger F of the user may be in direct contact with each other.

Figure 7:
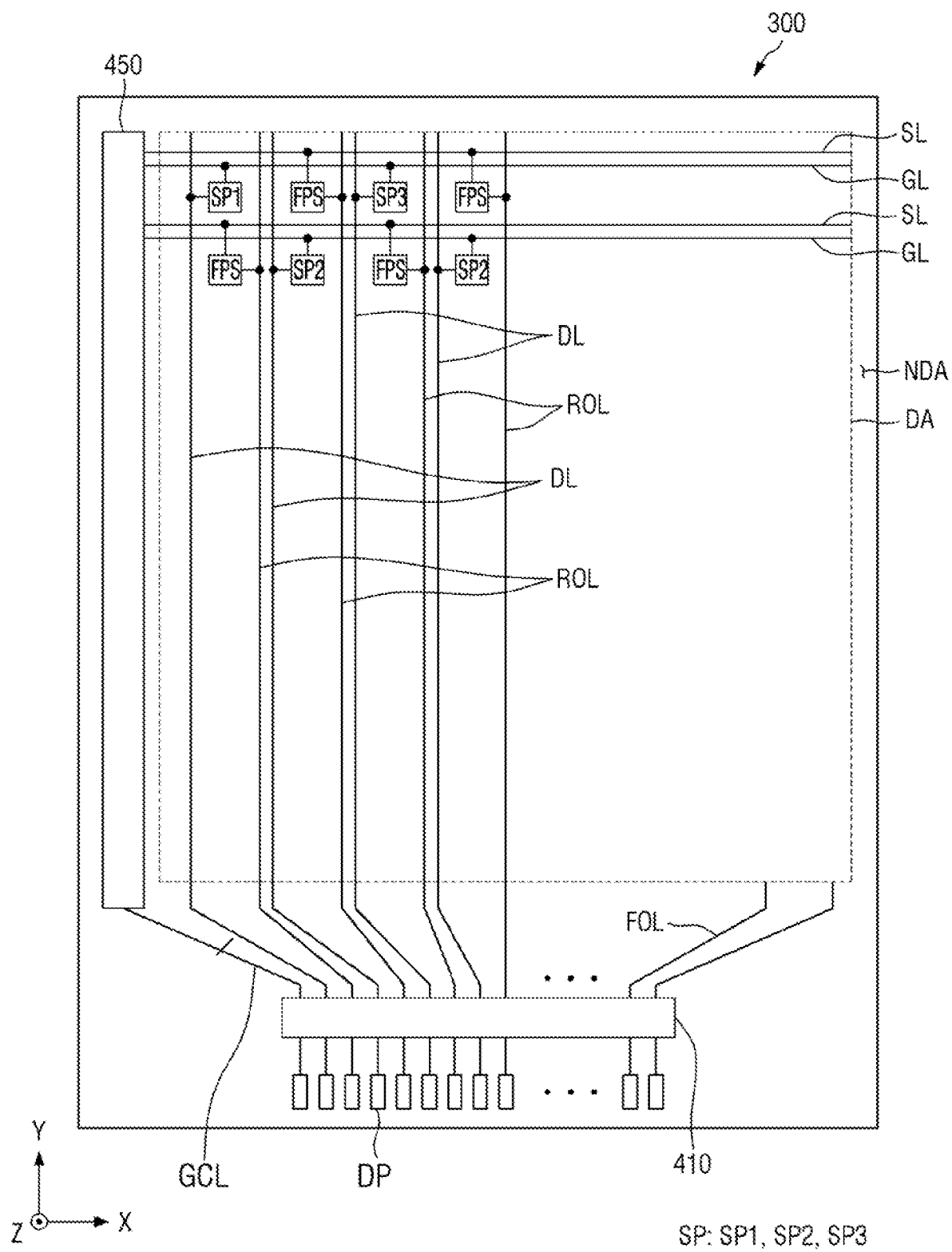
FIG. 7 is a layout view illustrating how pixels, fingerprint sensors, and lines of the display device of FIG. 1 are connected according to an embodiment of the present inventive concepts.

FIG. 7 is a layout view illustrating how the pixels, the fingerprint sensors, and the lines of the display device of FIG. 1 are connected.

Referring to the embodiment of FIG. 7, the display panel 300 may include the display area DA and the non-display area NDA.

The display area DA may include a plurality of pixels SP, gate lines GL and data lines DL which are connected to the pixels SP, a plurality of fingerprint sensors FPS, and sensing lines SL and read-out lines ROL, which are connected to the fingerprint sensors FPS.

Each of the pixels SP may be connected to at least one gate line GL and a data line DL. In an embodiment, each of the pixels SP may include three gate lines GL and one data line DL. However, embodiments of the present inventive concepts are not limited thereto.

Each of the pixels SP may include at least one pixel transistor ST, a light-emitting element ED, and a capacitor. The light-emitting element ED may receive a driving current and emit light in accordance with a data voltage applied to the gate electrode of the pixel transistor ST. For example, the light-emitting element ED may emit light of a particular luminance in accordance with the driving current.

The pixels SP may be connected to at least one power supply line. The pixels SP may receive various voltages from the at least one power supply line. For example, in an embodiment, the pixels SP may receive a driving voltage, an initialization voltage, and a low-potential voltage from at least one power supply line. However, embodiments of the present inventive concepts are not limited thereto.

Each of the fingerprint sensors FPS may be connected to at least one sensing line SL and a read-out line ROL. For example, in an embodiment, each of the fingerprint sensors FPS may be connected to two sensing lines SL and one read-out line ROL. However, embodiments of the present inventive concepts are not limited thereto.

Each of the fingerprint sensors FPS may include at least one sensor transistor FT, a light-receiving element PD, and a capacitor. Each of the fingerprint sensors FPS may receive light and may output a sensing signal. The fingerprint sensors FPS may provide sensing signals to the display driver 410 via the read-out lines ROL.

The fingerprint sensors FPS may be connected to at least one power supply line. The fingerprint sensors FPS may receive various voltages from the power supply line. In an embodiment, the fingerprint sensors may receive a reset voltage, a common voltage, and a low-potential voltage from at least one power supply line. However, embodiments of the present inventive concepts are not limited thereto.

As shown in the embodiment of FIG. 7, the gate lines GL and the sensing lines SL may extend in the first direction (or the X-axis direction) and may be spaced apart from one another in the second direction (or the Y-axis direction), which intersects the first direction (or the X-axis direction). In an embodiment, the gate lines GL and the sensing lines SL may be formed to extend parallel to each other.

The data lines DL and the read-out lines ROL may be spaced apart from one another in the first direction (or the X-axis direction) and may extend in the second direction (or the Y-axis direction). The data lines DL and the read-out lines ROL may be formed to extend parallel to each other.

In an embodiment, the non-display area NDA may be defined as the entire display panel 300 except 16r the display area DA. The non-display area NDA may include the display driver 410, a gate driver 450, fan-out lines FOL, and pads DP.

The display driver 410 may be connected to the pads DP and may receive digital video data and timing signals. The display driver 410 may convert the digital video data into analog data voltages and may provide the analog data voltages to the data lines DL via the fan-out lines FOL. The display driver 410 may receive sensing signals via the read-out lines ROL In an embodiment, the display driver 410 may be formed as an integrated circuit (IC) and may be mounted on the substrate SUB in a chip-on-glass (COG) or chip-on-plastic (COP) manner or via ultrasonic bonding. However, embodiments of the present inventive concepts are not limited thereto. The display driver 410 may generate gate control signals and may provide the gate control signals to the gate driver 450 via gate control lines GCL.

The gate driver 450 may be disposed on one side of the non-display area NDA. For example, as shown in the embodiment of FIG. 7, the gate driver 450 may be disposed on the left side of the non-display area NDA (e.g., in an opposite direction to the X-axis direction). However, embodiments of the present inventive concepts are not limited thereto. The gate driver 450 may generate gate signals based on the gate control signals and may provide the gate signals to the gate lines (IL. The gate lines GL may provide the gate signals to the pixels SP and may select pixels SP to which data voltages are to be provided.

The gate driver 450 may generate sensing signals based on the gate signals and may provide the sensing signals to the sensing lines SL. The sensing lines SL may provide the sensing signals to the fingerprint sensors FPS and may select fingerprint sensors FPS with which to sense the user's fingerprint.

The fan-out lines FOL may be disposed between the display driver 410 and the display area DA. For example, as shown in the embodiment of FIG. 7, the display driver 410 may be disposed on a lower side of the non-display area NDA (e.g., in an opposite direction of the Y-axis direction) and the fan-out lines FOL may extend between the non-display area NDA and the display area DA in the Y direction. However, embodiments of the present inventive concepts are not limited thereto. The fan-out lines FOL may connect the display driver 410 and the data lines DL and may connect the display driver 410 and the read-out lines ROL The pads DP may be disposed more adjacent than the display driver 410 to one edge of the display panel 300. For example, as shown in the embodiment, the pads DP may be disposed between a lower edge of the display panel 300 and the display driver 410 (e.g., in the Y direction). However, embodiments of the present inventive concepts are not limited thereto. The pads DP may be connected to the circuit board 420.

Figure 8:
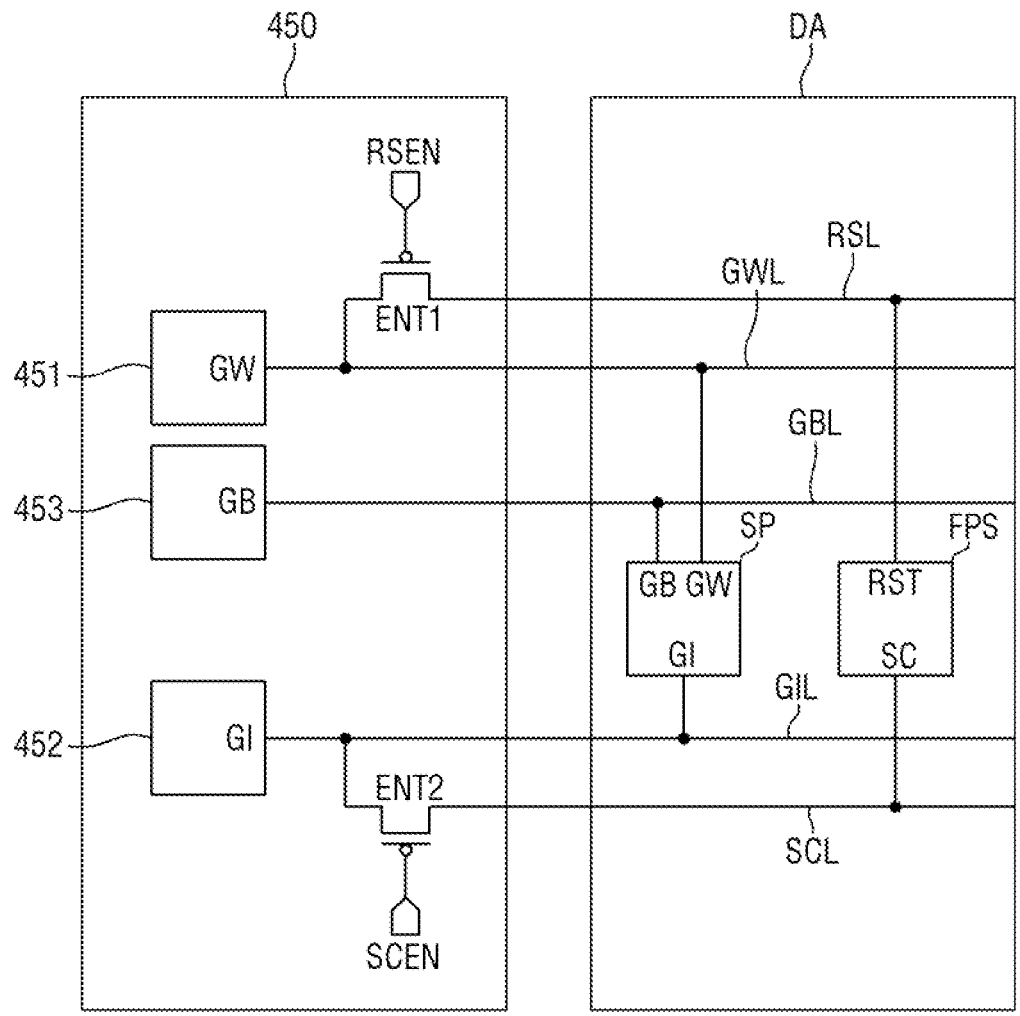
FIG. 8 is a block diagram illustrating how a gate driver, the pixels, and the fingerprint sensors of the display device of FIG. 1 are connected according to an embodiment of the present inventive concepts.

FIG. 8 is a block diagram illustrating how the gate driver, the pixels, and the fingerprint sensors of the display device of FIG. 1 are connected.

Referring to the embodiment of FIG. 8, the gate driver 450 may include a first gate signal supply module 451, a second gate signal supply module 452, a third gate signal supply module 453, a first switching element ENT1, and a second switching element ENT2. A gate GL may include first, second, and third gate lines GWL, GIL, and GEL, and a sensing line SL may include first and second sensing lines RSL and SCL.

The first gate signal supply module 451 may provide a first gate signal GW to the first gate line GWL. The first gate signal GW may be provided to the pixels SP via the first gate line GWL.

The second gate signal supply module 452 may provide a second gate signal GI to the second gate line GIL. The second gate signal GI may be provided to the pixels SP via the second gate line GIL.

The third gate signal supply module 453 may provide a third gate signal GB to the third gate line GBL. The third gate signal GB may be provided to the pixels SP via the third gate line GBL. Thus, the pixel SP may be driven by receiving the first, second, and third gate signals GW, GI, and GB from the first, second, and third gate lines OWL, GIL, and GBL, respectively.

The first switching element ENT1 may be turned on by a reset enable signal RSEN to connect the first gate line GWL to the first sensing line RSL. In an embodiment, the first gate signal OW GW may have a gate-on level during multiple horizontal scanning periods of a single frame so that the display device 10 may perform hysteresis compensation on the pixels SP. In response to the reset enable signal RSEN being received while the first gate signal OW GW has the gate-on level, the first switching element ENT1 may provide a reset signal RST to the first sensing line RSL. In an embodiment, if the first gate signal GW has the gate-on level during multiple horizontal scanning periods of a single frame, the reset enable signal RSEN may be provided to the first switching element ENT1 during the final horizontal scanning period. Thus, the first switching element ENT1 may generate an independent reset signal RST from the first gate signal GW based on the reset enable signal RSEN.

The second switching element ENT2 may be turned on by a scan enable signal SCE to connect the second gate line GIL to the second sensing line SCL. In an embodiment, the second gate signal GI may have the gate-on level during multiple horizontal scanning periods of a single frame so that the display device 10 may perform hysteresis compensation on the pixels SR In response to the scan enable signal SCEN being received while the second gate signal GI has the gate-on level, the second switching element ENT2 may provide a scan signal SC to the second sensing line SCL. In an embodiment, if the second gate signal CH has the gate-on level during multiple horizontal scanning periods of a single frame, the scan enable signal SCEN may be provided to the second switching element ENT2 during the final horizontal scanning period. Thus, the second switching element ENT2 may generate an independent scan signal SC from the second gate signal GI based on the scan enable signal SCEN.

The pixels SP and the fingerprint sensors FPS may be disposed in the same layer, e.g., in the light-emitting element layer EML, and the display driver 410 and the gate driver 450 may drive the pixels SP and the fingerprint sensors FPS. The gate driver 450 may drive the pixels SP based on the first, second, and third gate signals GW, GI, and GB. Since at least one of the first, second, and third gate signals GW, GI, and GB, such as the first and second gate signals GW, GI, have a gate-on level during multiple horizontal scanning periods of a single frame, the display device 10 may perform hysteresis compensation on the pixels SP. The gate driver 450 can generate the reset signal RST and the scan signal SC, which are independent from the first and second gate signals GW and GI, respectively, using the first and second switching elements ENT1 and ENT2, respectively. Accordingly, by providing the reset signal RST and the scan signal SC, which are independent from the first and second gate signals GW and GI, respectively, to the fingerprint sensors FPS, the gate driver 450 can increase the duration of exposure of the fingerprint sensors FPS to light, even when the display device 10 is performing hysteresis compensation, and can increase the sensitivity of the fingerprint sensors FPS.

Figure 9:
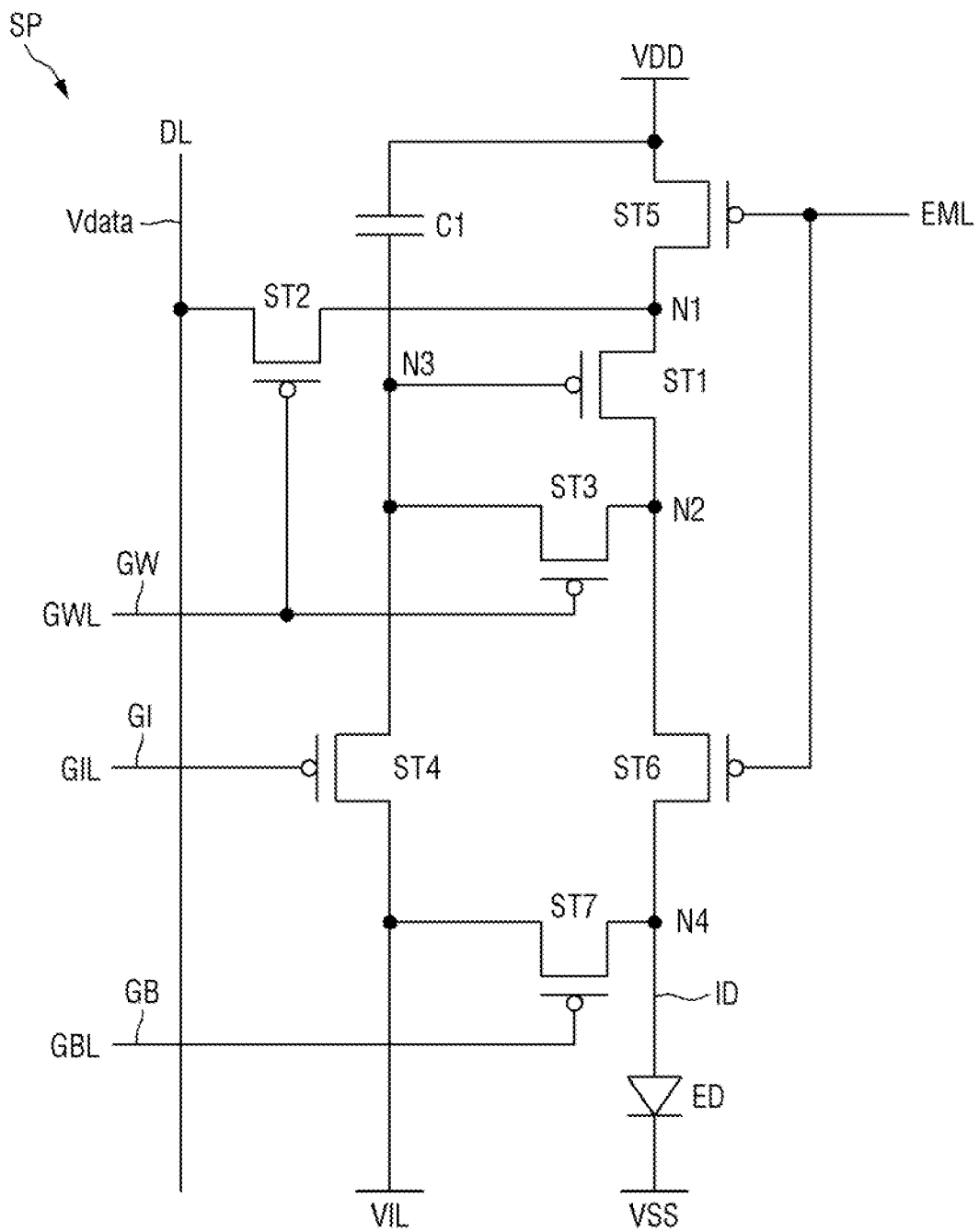
FIG. 9 is a circuit diagram of a pixel of the display device of FIG. 1 according to an embodiment of the present inventive concepts.

FIG. 9 is a circuit diagram of a pixel of the display device of FIG. 1.

Referring to FIG. 9, a pixel SP may be connected to the first gate line GWL, the second gate line GIL, the third gate line GBL, an emission control line EML, a data line DL, driving voltage line VDDL, and an initialization voltage line VIL.

As shown in the embodiment of FIG. 9, the pixel SP may include a light-emitting element ED, first through seventh pixel transistors ST1 through ST7, and a first capacitor C1. However, embodiments of the present inventive concepts are not limited thereto.

The first pixel transistor ST1 may include a gate electrode, a source electrode, and a drain electrode. The source electrode of the first pixel transistor ST1 may be connected to a first node N1, the drain electrode of the first pixel transistor ST1 may be connected to a second node N2, and the gate electrode of the first pixel transistor ST1 may be connected to a third node N3. In an embodiment, the first pixel transistor ST1 may control a source-drain current ID (hereinafter, the driving current I)) in accordance with a data voltage Vdata applied to the gate electrode of the first pixel transistor ST1.

The light-emitting element ED may receive the driving current ID and may thereby emit light. The amount of light emitted by the light-emitting element ED or the luminance of the light-emitting element ED may be proportional to the magnitude of the driving current ID.

In an embodiment, the light-emitting element ED may be an OLED including a first electrode, a second electrode, and an organic light-emitting layer between the first and second electrodes. However, embodiments of the present inventive concepts are not limited thereto. For example, the light-emitting element ED may be an inorganic light-emitting element including a first electrode, a second electrode, and an inorganic semiconductor between the first and second electrodes. The light-emitting element ED may be a quantum-dot light-emitting element including a first electrode, a second electrode, and a quantum-dot light-emitting layer between the first and second electrodes. The light-emitting element ED may be an mLED.

The first electrode or the anode of the light-emitting element ED may be connected to a fourth node N4, The first electrode of the light-emitting element ED may be connected do the drain electrodes of the sixth and seventh pixel transistors ST6 and ST7 via the fourth node N4, The second electrode of the light-emitting element ED may be connected to a low-potential line VSSL. Parasitic capacitance may be formed between the first and second electrodes of the light-emitting element ED.

The second pixel transistor ST2 may be turned on by the first gate signal GW from the first gate line GWL to connect the data line DL and the first node N1, which is the source electrode of the first pixel electrode ST1. The second pixel transistor ST2 may be turned on by the first gate signal GW to provide the data voltage Vdata to the first node N1. As shown in the embodiment of FIG. 9, the gate electrode of the second pixel transistor ST2 may be connected to the first gate line GWL, the source electrode of the second pixel transistor ST2 may be connected to the data line DL, and the drain electrode of the second pixel transistor ST2 may be connected to the first node N1. The drain electrode of the second pixel transistor ST2 may be connected to the source electrode of the first pixel transistor ST1 and the drain electrode of the fifth pixel transistor ST5 via the first node N1.

The third pixel transistor ST3 may be turned on by the first gate signal GW from the first gate line OWL to connect the second node N2, which is the drain electrode of the first pixel transistor ST1, and the third node N3, which is the gate electrode of the first pixel transistor ST1, The gate electrode of the third pixel transistor ST3 may be connected to the first gate line OWL, the source electrode of the third pixel transistor ST3 may be connected to the second node N2, and the drain electrode of the third pixel transistor ST3 may be connected to the third node N3. The source electrode of the third pixel transistor ST3 may be connected to the drain electrode of the first pixel transistor ST1 and the source electrode of the sixth pixel transistor ST6 via the second node N2. The drain electrode of the third pixel transistor ST3 may be connected to the gate electrode of the first pixel transistor ST1, the drain electrode of the fourth pixel transistor ST4, and the first electrode of the first capacitor C1 via the third node N3.

The fourth pixel transistor ST4 may be turned on by the second gate signal GI from the second gate line GIL to connect the initialization voltage line VIL and the third node N3, which is the gate electrode of the first pixel transistor ST1. The fourth pixel transistor ST4 may be turned on by the second gate signal GI to discharge the gate electrode of the first pixel transistor ST1 to an initialization voltage. The gate electrode of the fourth pixel transistor ST4 may be connected to the second gate line GIL, the source electrode of the fourth pixel transistor ST4 may be connected to the initialization voltage line VIL, and the drain electrode of the fourth pixel transistor ST4 may be connected to the third node N3. The drain electrode of the fourth pixel transistor ST4 may be connected to the gate electrode of the first pixel transistor ST1, the drain electrode of the third pixel transistor ST3, and the first electrode of the first capacitor C1 via the third node N3.

The fifth pixel transistor ST5 may be turned on by an emission signal from the emission control line EMI, to connect the driving voltage line VDDL and the first node N1, which is the source electrode of the first pixel transistor ST1 The gate electrode of the fifth pixel transistor ST5 may be connected to the emission control line EML, the source electrode of the fifth pixel transistor ST5 may be connected to the driving voltage line VDRL, and the drain electrode of the fifth pixel transistor ST5 may be connected to the first node N1. The drain electrode of the fifth pixel transistor ST5 may be connected to the source electrode of the first pixel transistor ST1 and the drain electrode of the second pixel transistor ST2 via the first node N1.

The sixth pixel transistor ST6 may be turned on by the emission signal from the emission control line EML to connect the second node N2, which is the drain electrode of the first pixel transistor ST1, and the fourth node N4, which is the first electrode of the light-emitting element ED. The gate electrode of the sixth pixel transistor ST6 may be connected to the emission control line EML, the source electrode of the sixth pixel transistor ST6 may be connected to the second node N2, and the drain electrode of the sixth pixel transistor ST6 may be connected to the fourth node N4. The source electrode of the sixth pixel transistor ST6 may be connected to the drain electrode of the first pixel transistor ST1 and the source electrode of the third pixel transistor ST3 via the second node N2. The drain electrode of the sixth pixel transistor ST6 may be connected to the first electrode of the light-emitting element ED and the drain electrode of the seventh pixel transistor ST7 via the fourth node N4.

In an embodiment in which the fifth pixel transistor ST5, the first pixel transistor ST1, and the sixth pixel transistor ST6 are all turned on, the driving current ID may be provided to the light-emitting element ED.

The seventh pixel transistor ST7 may be turned on by the gate signal GB from the third gate line GBL to connect the initialization voltage line VIL and the fourth node N4, which is the first electrode of the light-emitting element ED. The seventh pixel transistor ST7 may be turned on by the gate signal GB to discharge the first electrode of the light-emitting element ED to the initialization voltage. The gate electrode of the seventh pixel transistor ST7 may be connected to the third gate line GBL, the source electrode of the seventh pixel transistor ST7 may be connected to the initialization voltage line VIL, and the drain electrode of the seventh pixel transistor ST7 may be connected to the fourth node N4. The drain electrode of the seventh pixel transistor ST7 may be connected to the first electrode of the light-emitting element ED and the drain electrode of the sixth pixel transistor ST6 via the fourth node N4.

In an embodiment, each of first through seventh pixel transistors ST1 through ST7 may include a silicon (Si)-based active layer. For example, each of the first through seventh pixel transistors ST1 through ST7 may include a low-temperature polycrystalline silicon (LTPS)-based active layer. The LIPS-based active layer may have excellent electron mobility and excellent turn-on characteristics. As the display device 10 includes the first through seventh pixel transistors ST1 through ST7 with excellent turn-on characteristics in each of a plurality of pixels SP, the display device 10 can drive the plurality of pixels SP stably and efficiently.

In an embodiment, the first through seventh pixel transistors ST1 through ST7 may be p-type pixel transistors. For example, the first through seventh transistors ST1 through ST7 may output a current input to their source electrodes to their drain electrodes based on a gate-low voltage applied to their gate electrodes.

The capacitor C1 may be connected between the third node N3, which is the gate electrode of the first pixel transistor ST1, and the driving voltage line VDDL. In an embodiment, the first electrode of the capacitor C1 may be connected to the third node N3, and the second electrode of the capacitor C1 may be connected to the driving voltage line VDDL. However, embodiments of the present inventive concepts are not limited thereto. Accordingly, the difference in electric, potential between the driving voltage line VDDL and the gate electrode of the first pixel transistor ST1 can be maintained.

Figure 10:
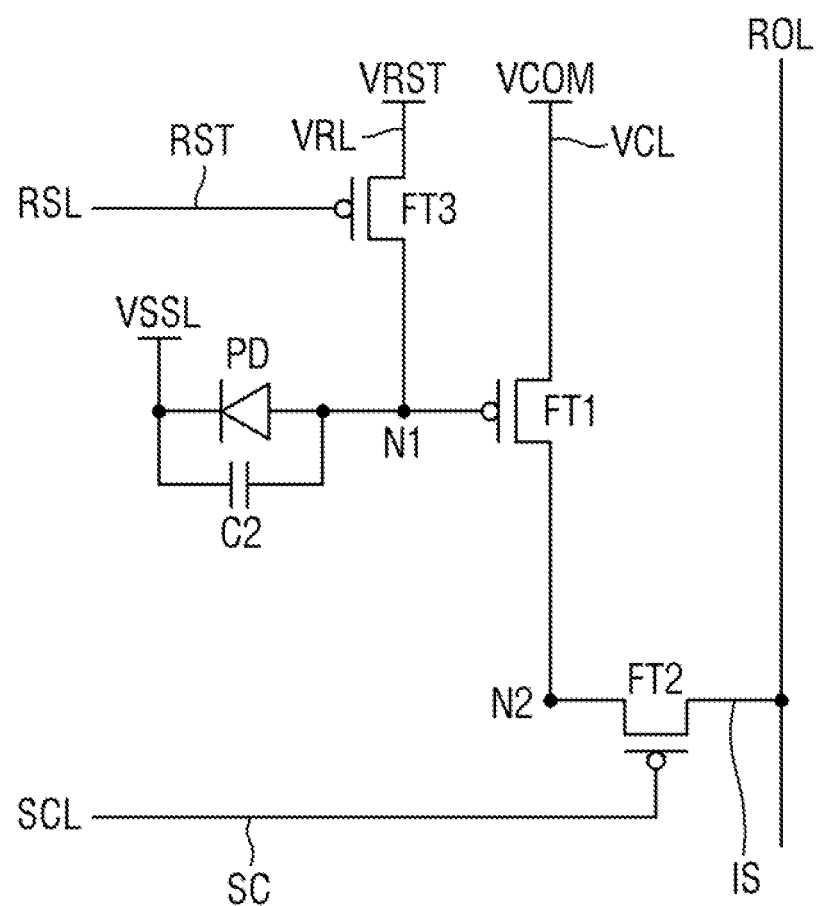
FIG. 10 is a circuit diagram of a fingerprint sensor of the display device of FIG. 1 according to an embodiment of the present inventive concepts.

FIG. 10 is a circuit diagram of a fingerprint sensor of the display device of FIG. 1.

Referring to FIG. 10, a fingerprint sensor FPS may be connected to the first sensing line RSL, the second sensing line SCL, and the read-out line ROL.

The fingerprint sensor FPS may include first, second, and third sensor transistors FT1, FT2, and FT3, a light-receiving element PD, and a second capacitor C2.

The first sensor transistor FT1 may be turned on by the voltage of a first node N1 to provide a common voltage VCOM to a second node N2. The gate electrode of the first sensor transistor FT1 may be connected to the first node N1, the source electrode of the first sensor transistor FT1 may be connected to a common voltage line VCL, and the drain electrode of the first sensor transistor FT1 may be connected to the second node N2. The first sensor transistor FT1 may control a source-drain current IS (hereinafter, the sensing current IS) based on the voltage of the first node N1, which is the first electrode of the light-receiving element PD. The sensing current IS, which flows through the channel of the first sensor transistor FT1, may be proportional to the square of the difference between a voltage Vsg, which is the voltage between the source and gate electrodes of the first sensor transistor FT1, and a threshold voltage Vth between the source electrode and the gate electrode of the first sensor transistor FT1. For example, in an embodiment, the sensing current IS may be determined by the following equation: $IS = k' \times (Vsg - Vth)^2$ where $k'$ is a proportionality coefficient determined by the structure and physical characteristics of the first sensor transistor FT1, Vsg is the source-gate voltage of the first sensor transistor FT1, and Vth is the threshold voltage of the first sensor transistor FT1. The sensing current IS of the first sensor transistor FT1 may be provided to the read-out line ROL as a sensing signal through the second sensor transistor FT2.

The second sensor transistor FT2 may be turned on by a scan signal SC from the second sensing line SCL to connect the second node N2, which is the drain electrode of the first sensor transistor FT1, and the read-out line ROL. The gate electrode of the second sensor transistor FT2 may be connected to the second sensing line SCL, the source electrode of the second sensor transistor FT2 may be connected to the second node N2, and the drain electrode of the second sensor transistor FT2 may be connected to the read-out line ROL.

The third sensor transistor FT3 may be turned on by the reset signal RST from the first sensing line RSL to provide a reset voltage VRST to the first node N1. The third sensor transistor FT3 may be turned on by the reset signal RST to reset the first node N1, which is the gate electrode of the first sensor transistor FT1. The gate electrode of the third sensor transistor FT3 may be connected to the first sensing line RSL, the source electrode of the third sensor transistor FT3 may be connected to a reset voltage line and the drain electrode of the third sensor transistor FT3 may be connected to the first node N1.

The light-receiving element PD may recognize the pattern of the user's fingerprint based on the second light L2 (FIG. 5), which is reflected light from the finger F of the user. The first electrode of the light-receiving element P1) may be connected to the first node N1, which is the gate electrode of the first sensor transistor FT1, and the second electrode of the light-receiving element P11) may be connected to the low-potential line VSSL. The second electrode of the light-receiving element PD may receive a low-potential voltage from the low-potential line VSSL. The second electrode of the light-receiving element PD may receive the same low-potential voltage as the second electrode of the light-emitting element ED. The second capacitor C2 is disposed between the first and second electrodes of the light-receiving to element PD and can prevent an excessive current in the light-receiving element PD.

As shown in the embodiment of FIG. 5, in response to the finger F of the user being placed on, and in contact with the cover window 100, the light-receiving element PD may receive the second light L2, which is reflected light from a ridge FR or valley FV of the finger F, The first light L1, which is output from the light-emitting element layer EML, may be reflected by the ridges FR or the valleys FV of the finger F, and the reflected first light, such as the second light L2, may reach the light-receiving element P1). The light-receiving element PD may convert the energy of the second light L2 into an electrical signal (e.g., a current or a voltage) formed between the first and second electrodes thereof, and the electrical signal may flow from the first node N1 to the low-potential line VSSL.

The display driver 410 may generate sensing data based on the sensing signal from the fingerprint sensor FPS, and the main processor 710 may recognize the pattern of the user's fingerprint by determining whether the sensing data corresponds to a ridge FR or a valley FV of the finger F.

In an embodiment, the light-receiving element PD may be implemented as a phototransistor or a photodiode. However, embodiments of the present inventive concepts are not limited thereto. The light-receiving element PD may correspond to an optical sensor that converts light energy into electrical energy and may use a photovoltaic effect, in which a current varies in accordance with the intensity of light.

Figure 11:
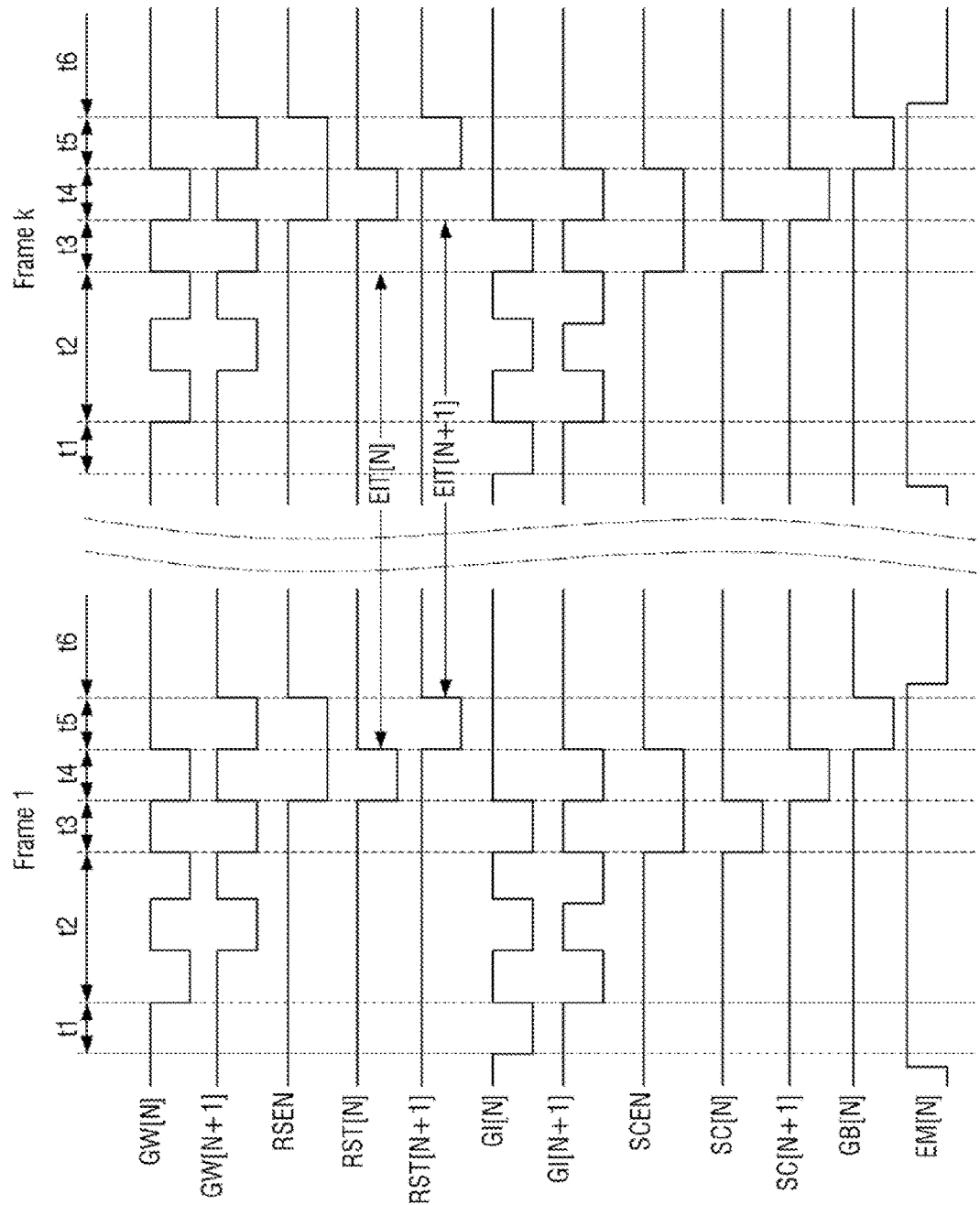
FIG. 11 is a waveform view of signals applied to the pixel of FIG. 9 and the fingerprint sensor of FIG. 10 according to an embodiment of the present inventive concepts.

FIG. 11 is a waveform view of signals applied to the pixel of FIG. 9 and the fingerprint sensor of FIG. 10.

Referring to the embodiment FIG. 11, the first, second, and third gate lines OWL, GIL, and GBL may provide the first, second, and third gate signals GW, GI, and GB, respectively. The first and second sensing lines RSL and SCL may provide the reset signal RST and the scan signal SC, respectively.

A frame may include first through sixth periods t1 through t6. Each of the first through sixth periods t1 through t6 may include at least one horizontal scanning period. In an embodiment, each of the first, third, fourth, and fifth periods t1, t3, t4, and t5 may include one horizontal scanning period, the second period t2 may include three horizontal scanning periods, and the sixth period t6 may include more horizontal scanning periods than the second period t2.

As at least one of the first, second, and third gate signals GW, GI, and GB, such as the first and second gate signals GW, GI, have a gate-on level during multiple horizontal scanning periods of a single frame (e.g., a first frame "Frame 1"), the display device 10 can perform hysteresis compensation on multiple pixels SP.

In an embodiment in which the first gate signal GW has the gate-on level during multiple horizontal scanning periods of the first frame "Frame 1", the reset enable signal RSEN may be provided to the first switching element ENT1 during the final horizontal scanning period of the first frame "Frame 1". For example, in an embodiment, a first gate signal GW [N], which is to be provided to a first gate line GWL for an N-th row (where N is a natural number), may have the gate-on level three times during the second and fourth periods t2 and t4. The gate driver 450 may provide the reset enable signal RSEN during the fourth and fifth periods t4 and t5. Thus, the first switching element ENT1 may generate a reset signal RST (N) having the gate-on level during the fourth period t4, based on the reset enable signal RSEN. The first switching element ENT1 may generate an independent reset signal RST (N) from the first gate signal GW [N] based on the reset enable signal RSEN.

In an embodiment in which the second gate signal GI has the gate-on level during multiple horizontal scanning periods of the first frame "Frame 1.", the scan enable signal SCEN may be provided to the second switching element ENT2 during the final horizontal scanning period of the first frame "Frame 1", For example in an embodiment, a second gate signal GI[N], which is to be provided to a second gate line GIL for the N-th row, may have the gate-on level three times during the first, second, and third periods t1, t2, and t3. The gate driver 450 may provide the scan enable signal SCEN during the third and fourth periods t3 and t4, Thus, the second switching element ENT2 may generate a scan signal SC(N) having the gate-on level during the third period t3, based on the scan enable signal SCEN. The second switching element ENT2 may generate an independent scan signal SC(N) from the second gate signal GI[N] based on the scan enable signal SCEN.

The first and second gate signals OW and GI may have the gate-on level over a plurality of frames, and the reset enable signal RSEN and the scan enable signal SCEN may have the gate-on level over at least one frame of the plurality of frames. Thus, the display device 10 can select a frame in which to drive a plurality of fingerprint sensors FPS from among the plurality of frames, even when a plurality of pixels SP are to be driven over the plurality of frames.

The pixels SP and the fingerprint sensors FPS may be disposed in the light-emitting element layer EML, and the display driver 410 and the gate driver 450 may drive the pixels SP and the fingerprint sensors FPS, The gate driver 450 may drive the pixels SP based on the first, second, and third gate signals OW, GI, and GB. As at least one of the first, second, and third gate signals GW, GI, and GB, such as the first and second gate signals GW, GI, has the gate-on level during multiple horizontal scanning periods of a single frame, the display device 10 can perform hysteresis compensation on the pixels SR The gate driver 450 may generate an independent reset signal RST and an independent scan signal SC from the first and second gate signals OW and GI, using the first and second switching elements ENT1 and ENT2. Thus, the gate driver 450 provides the reset signal RST and the scan signal SC, which are independent from the first and second gate signals OW and GI, to the fingerprint sensors FPS and can thus increase the duration of exposure of the fingerprint sensors FPS to light, such as EIT[N], and increase the sensitivity of the fingerprint sensors FPS even when the display device 10 is performing hysteresis compensation.

What is claimed is:

1. A display device comprising:
a display panel comprising a plurality of pixels connected to gate lines and data lines, and a plurality of fingerprint sensors connected to sensing lines and read-out lines; and
a gate driver providing gate signals to the gate lines and providing sensing signals to the sensing lines, the sensing lines providing the sensing signals to the plurality of fingerprint sensors,
wherein the gate driver comprises:
a first gate signal supply module providing a first gate signal to a first gate line among the gate lines; and
a first switching element turned on by a reset enable signal, wherein the first switching element connects the first gate line and a first sensing line among the sensing lines to each other, and
wherein in response to the reset enable signal being received when the first gate signal has a gate-on level, the first switching element provides a reset signal to the first sensing line.

2. The display device of claim 1, wherein:
the first gate signal has the gate-on level during a plurality of horizontal scanning periods of a single frame; and
the reset enable signal is provided to the first switching element during a final horizontal scanning period of the plurality of horizontal scanning periods.

3. The display device of claim 1, wherein:
the first gate signal has the gate-on level over a plurality of frames, and
the reset enable signal is provided to the first switching element over at least one frame of the plurality of frames.

4. The display device of claim 1, wherein the gate driver further comprises:
a second gate signal supply module providing a second gate signal to a second gate line among the gate lines; and
a second switching element turned on by a scan enable signal to connect the second gate line to a second sensing line among the sensing lines.

5. The display device of claim 1, wherein each of the plurality of pixels comprises:
a light-emitting element;
a first pixel transistor controlling a driving current that is provided to the light-emitting element;
a second pixel transistor selectively providing a data voltage to a first node, the first node is a first electrode of the first pixel transistor;
a third pixel transistor selectively connecting a second node and a third node, the second node is a second electrode of the first pixel transistor, and the third node is a gate electrode of the first pixel transistor; and
a fourth pixel transistor selectively providing an initialization voltage to the third node.

6. The display device of claim 1, wherein
the plurality of pixels comprise first, second, and third pixels emitting light of different colors,
the display panel comprises a plurality of unit pixel areas, and
each of the plurality of unit pixel areas comprises at least one of each of the first, second, and third pixels and at least one fingerprint sensor.

7. The display device of claim 1, wherein the display panel comprises:
a substrate;
a thin-film transistor (TFT) layer disposed on the substrate; and
a light-emitting element layer disposed on the thin-film transistor layer, the thin film transistor layer comprises:
a gate insulating film disposed on the substrate; and
an interlayer insulating film disposed on the gate insulating film, and
each of the plurality of pixels include a light-emitting element and each of the plurality of fingerprint sensors includes a light-receiving element, the light-emitting elements and the light-receiving elements are disposed in the light-emitting element layer.

8. The display device of claim 1, wherein the display panel further comprises a display driver providing data voltages to the data lines and receiving sensing signals from the read-out lines.

9. The display device of claim 1, wherein:
the gate lines and the sensing lines extend in a first direction and are spaced apart from one another in a second direction intersecting the first direction; and
the data lines and the read-out lines extend in the second direction and are spaced apart from one another in the first direction.

10. The display device of claim 4, wherein in response to the scan enable signal being received when the second gate signal has a gate-on level, the second switching element provides a scan signal to the second sensing line.

11. The display device of claim 5, wherein:
the second and third pixel transistors are turned on by the first gate signal; and
the fourth pixel transistor is turned on by a second gate signal.

12. The display device of claim 5, wherein each of the plurality of pixels further comprises:
a fifth pixel transistor selectively providing a driving voltage to the first node;
a sixth pixel transistor selectively connecting the second node and a fourth node, the fourth node is a first electrode of the light-emitting element; and
a seventh pixel transistor selectively providing the initialization voltage to the fourth node.

13. The display device of claim 7, wherein each of the plurality of pixels comprises:
a pixel transistor including an active area, a source electrode, and a drain electrode that are disposed on the substrate;
the pixel transistor further includes a gate electrode disposed on the gate insulating film; and
a first connecting electrode is disposed on the interlayer insulating film and is connected to the drain electrode of the pixel transistor.

14. The display device of claim 7, wherein each of the plurality of fingerprint sensors comprises:
a sensor transistor including an active area, a source electrode, and a drain electrode that are disposed on the substrate;
the sensor transistor further includes a gate electrode disposed on the gate insulating film; and
a second connecting electrode is disposed on the interlayer insulating film and is connected to the drain electrode of the sensor transistor.

15. The display device of claim 10, wherein:
the second gate signal has the gate-on level during a plurality of horizontal scanning periods of a single frame; and the scan enable signal is provided to the second switching element during a final horizontal scanning period of the plurality of horizontal scanning periods.

16. The display device of claim 10, wherein each of the plurality of fingerprint sensors comprises:
- a light-receiving element;
- a first node that is a first electrode of the light-receiving element;
- a first sensor transistor providing a common voltage to a second node based on a voltage of the first node;
- a second sensor transistor selectively connecting the second node and one of the read-out lines; and
- a third sensor transistor selectively providing a reset voltage to the first node.

17. The display device of claim 13, wherein each of the light-emitting elements comprises:
- a pixel electrode disposed on the thin-film transistor layer and connected to the first connecting electrode;
- a light-emitting layer disposed on the pixel electrode; and
- a common electrode disposed on the light-emitting layer.

18. The display device of claim 14, wherein each of the light-receiving elements comprises:
- a sensor electrode disposed on the thin-film transistor layer and connected to the second connecting electrode;
- a light-receiving layer disposed on the sensor electrode; and
- a common electrode disposed on the light-receiving layer.

19. The display device of claim 16, wherein:
- the second sensor transistor is turned on by the scan signal; and
- the third sensor transistor is turned on by the reset signal.

* * * * *